United States Patent
Li et al.

(10) Patent No.: US 9,217,105 B2
(45) Date of Patent: Dec. 22, 2015

(54) OXYCARBONITRIDE PHOSPHORS AND LIGHT EMITTING DEVICES USING THE SAME

(71) Applicant: Lightscape Materials, Inc., Princeton, NJ (US)

(72) Inventors: Yuanqiang Li, Plainsboro, NJ (US); Michael D. Romanelli, East Brunswick, NJ (US); Yongchi Tian, Princeton Junction, NJ (US)

(73) Assignee: Lightscape Materials, Inc., Princeton, NJ (US)

( * ) Notice: Subject to any disclaimer, the term of this patent is extended or adjusted under 35 U.S.C. 154(b) by 116 days.

(21) Appl. No.: 14/279,769

(22) Filed: May 16, 2014

(65) Prior Publication Data

US 2014/0265820 A1 Sep. 18, 2014

Related U.S. Application Data

(60) Continuation of application No. 13/950,354, filed on Jul. 25, 2013, now Pat. No. 8,771,547, which is a division of application No. 13/046,388, filed on Mar. 11, 2011, now Pat. No. 8,551,361.

(60) Provisional application No. 61/334,967, filed on May 14, 2010, provisional application No. 61/381,862, filed on Sep. 10, 2010.

(51) Int. Cl.
*H01L 33/50* (2010.01)
*C09K 11/77* (2006.01)
*C09K 11/08* (2006.01)
*F21K 99/00* (2010.01)
*H01J 1/63* (2006.01)
*H01J 29/20* (2006.01)

(52) U.S. Cl.
CPC .......... *C09K 11/7728* (2013.01); *C09K 11/0883* (2013.01); *C09K 11/7705* (2013.01); *C09K 11/7706* (2013.01); *C09K 11/7731* (2013.01); *C09K 11/7733* (2013.01); *C09K 11/7734* (2013.01); *F21K 9/56* (2013.01); *H01J 1/63* (2013.01); *H01J 29/20* (2013.01); *H01L 33/502* (2013.01)

(58) Field of Classification Search
CPC   H01L 33/502; H01L 33/504; C09K 11/0083; C09K 11/7706; C09K 11/77721; C09K 11/7734; C09K 11/7792; C09K 11/7731; C09K 11/7789; C09K 11/66
See application file for complete search history.

(56) References Cited

U.S. PATENT DOCUMENTS 8,535,566 B2 * 9/2013 Li ...................... C09K 11/0883
                                                          252/301.4 F
2010/0109508 A1    5/2010 Okuyama et al.

FOREIGN PATENT DOCUMENTS

JP         2009079069           4/2009

* cited by examiner

*Primary Examiner* — Carol M Koslow
(74) *Attorney, Agent, or Firm* — Thomas S. Deibert

(57) ABSTRACT

A family of oxycarbonitride phosphor compositions is provided. Also provided are light emitting devices incorporating the oxycarbonitride phosphor compositions.

8 Claims, 26 Drawing Sheets

OXYCARBONITRIDE PHOSPHORS AND LIGHT EMITTING DEVICES USING THE SAME

This application is a continuation of U.S. patent application Ser. No. 13/950,354 filed on Jul. 25, 2013; which is a divisional of U.S. patent application Ser. No. 13/046,388 filed Mar. 11, 2011, now U.S. Pat. No. 8,551,361; which claims priority to U.S. Provisional Application Nos. 61/334,967 filed May 14, 2010, and 61/381,862 filed Sep. 10, 2010, the disclosures of which are all hereby incorporated by reference in their entireties.

This invention was made with U.S. Government support under Department of Energy grant number DE-EE003245. The U.S. Government may have certain rights in this invention.

All patents, publications, and non-patent references referred to herein shall be considered incorporated by reference into this application in their entireties.

In recent years, R&D efforts have been intense on both LED chip and phosphors for phosphor-converted LED (pcLED), with the result that both efficient high-power LEDs and efficient phosphors have been demonstrated. However, a unique aspect of the phosphors operating in pcLED is that the phosphors are in close vicinity of the LED chip, and the LEDs operate at high temperatures. Typical junction temperatures of high power LEDs are in the range of 100° C.-150° C. At these temperatures, the crystal of the phosphor is at a high vibrationally excited state, causing the excitation energy to be directed to heat emission through lattice relaxation rather than to the desired luminescence emission. Moreover, these lattice relaxations produce heating with vibrational excitation, and thereby further reduce the luminescence emission efficiency. This is a vicious cycle that precludes successful applications of existing phosphor materials. The pcLED lamp for general illumination application requires high optical energy flux (e.g., higher than 1 Watt/mm$^2$) which causes additional heating by a Stokes shift generated inside the phosphor crystals. Successful development of pcLED lamps for general illumination, therefore, requires phosphors that can operate highly efficiently at temperatures of 100° C.-150° C. The risk is that it is difficult both to achieve 90% quantum yield at room temperature and to have high thermal stability at 100° C.-150° C. The thermal stability of a phosphor's luminescence is an intrinsic property of the phosphor which is determined by the composition and the structure of the crystalline material.

Oxynitride phosphors have been considered for use in pcLEDs because of their excellent luminescence performance at high temperature range mentioned above. Prominent examples are the sialon-based phosphors whose host crystals are constituted by chemical bonds of Si—N, Si—O, Al—N and Al—O as the backbone of the host crystal structure. Each of the oxynitride phosphors discovered so far comprises predominantly a single crystalline phase, and often a second phase is considered an "impurity". However, phosphors are generally materials that permit non stoichiometric proportions and are usually heterogeneous. In this invention, a group of oxycarbonitride phosphor compositions are demonstrated to be comprised of more than one unique crystalline phase, each of which fluoresces highly efficiently.

The introduction of carbon or carbide into crystalline phosphor materials has previously been considered detrimental in luminescence performance. The often dark body color of various carbides may be a source of absorption or quenching of emission light. Also, residual unreacted carbide that remains after phosphor preparation utilizing carbon or carbide processes can binder the emission intensity of the phosphor.

Carbonitride phosphors are comprised of carbon, nitrogen, silicon, aluminum and/or other metals in the host crystal and one or more metal dopants as a luminescent activator. This class of phosphors recently emerged as a color converter capable of converting near UV (nUV) or blue light to green, yellow, orange and red light. The host crystal of carbonitride phosphors is comprised of —N—Si—C— networks in which the strong covalent bonds of Si—C and Si—N serve as the main structural components. Generically, the network structure formed by Si—C bonds has a strong absorption in the entire visible light spectral region, and therefore has been previously considered not suitable for use in host materials for high efficiency phosphors. For example, in certain nitride-silicon-carbide phosphors in which Ce$^{3+}$ is the dopant, the electronic interaction between Ce$^{3+}$ and the —N—Si—C— networks results in a strong absorption in 400-500 nm wavelengths, making the phosphor less reflective in that particular spectral region of visible light. This effect is detrimental to achieving a phosphor having a high emission efficiency.

It has now been discovered that in certain oxycarbonitride phosphor compositions, carbide actually enhances, rather than quenches, the luminescence of a phosphor, in particular at relatively high temperatures (e.g. 200° C.-400° C.). The invention demonstrates that the reflectance of certain oxycarbonitride phosphors in the wavelength range of visible light decreases as the amount of carbide increases. These carbide-containing phosphors have excellent thermal stability of emission and high emission efficiency.

SUMMARY OF INVENTION

In certain embodiments, the present invention is directed to a novel family of oxycarbonitride phosphors expressed by:

$$M(II)_a Si_b O_c N_d C_e : A \qquad (1)$$

wherein 6<a<8, 8<b<14, 13<c<17, 5<d<9, and 0<e<2, preferably 6.5<a<7.5, 8.5<b<12.5, 14<c<16, 6<d<7.5, and 0<e<1. M(II) comprises at least one divalent cation, and may be selected from the group including Be, Mg, Ca, Sr, Ba, Cu, Co, Ni, Pd, Zn, Cd and other divalent transition metal ions. A comprises a luminescence activator doped in the crystal structure at a concentration level from about 0.001 mol % to about 20 mol %, preferably from about 0.1 mol % to about 10 mol %, relative to M(II). A can be at least one metal ion selected from the group including Ce, Pr, Nd, Sm, Eu, Gd, Tb, Dy, Ho, Er, Tm, Yb, Lu, Mn, Bi, Sb, preferably Eu$^{2+}$, Ce$^{3+}$, Tb$^{3+}$, Yb$^{2+}$ and Mn$^{2+}$.

In certain embodiments, the present invention is directed to a novel family of oxycarbonitride phosphors expressed by;

$$M(II)_7 Al_{12-x-y} Si_{x+y} O_{25-x} N_{x-y} C_y : A \qquad (2)$$

wherein 0<x≤12, 0<y<x, and 0<x+y≤12. M(II) comprises at least one divalent cation, and may be selected from the group including Be, Mg, Ca, Sr, Ba, Cu, Co, Ni, Pd, Zn, Cd and other divalent transition metal ions. A comprises a luminescence activator doped in the crystal structure at a concentration level from about 0.001 mol % to about 20 mol %, preferably from about 0.1 mol % to about 10 mol %, relative to M(H). A can be at least one metal ion selected from the group including Ce, Pr, Nd, Sm, Eu, Gd, Tb, Dy, Ho, Er, Tm, Yb, Lu, Mn, Bi, Sb, preferably Eu$^{2+}$, Ce$^{3+}$, Tb$^{3+}$, Yb$^{2+}$ and Mn$^{2+}$.

In certain embodiments, the present invention is directed to a novel family of oxycarbonitride based phosphors expressed by:

$$M(II)_7M(III)_{12-x-y}Si_{x+y}O_{25-x}N_{x-y}C_y:A \quad (3)$$

wherein $0<x\leq 12$, $0<x+y\leq 12$, and $0<y<x$. M(II) comprises at least one divalent cation, and may be selected from the group including Be, Mg, Ca, Sr, Ba, Cu, Co, Ni, Pd, Zn, Cd and other divalent transition metal ions. M(III) comprises at least one trivalent cation, and may be selected from the group including B, Al, Ga, In, Sc, Y, La and Gd, and other trivalent metal ions. A comprises a luminescence activator doped in the crystal structure at the concentration level of from about 0.001 mol % to about 20 mol %, preferably from about 0.1 mol % to about 10 mol %, relative to M(II). A can be at least one metal ion selected from the group including Ce, Pr, Nd, Sm, Eu, Gd, Tb, Dy, Ho, Er, Tm, Yb, Lu, Mn, Bi, Sb, preferably $Eu^{2+}$, $Ce^{3+}$, $Tb^{3+}$, $Yb^{2+}$ and $Mn^{2+}$.

In certain embodiments, the present invention is directed to a novel family of oxycarbonitride based phosphors expressed by:

$$M(II)_7M(III)_{12-x-y}Si_{x+y}O_{25-x\pm 3\delta/2}N_{x\pm\delta-y}C_y:A \quad (4)$$

and $$M(II)_7M(III)_{12-x-y}Si_{x+y}O_{25-x\pm\delta/2}N_{x\pm\delta-y}C_{y\pm\delta/2}:A \quad (4a)$$

wherein $0<x<12$, $0\leq y<x$, $0<x+y\leq 12$, $0<\delta\leq 3$, and $\delta<x+y$. M(II) comprises at least one divalent cation, and may be selected from the group including Be, Mg, Ca, Sr, Ba, Cu, Co, Ni, Pd, Zn, Cd and other divalent transition metal ions. M(III) comprises at least one trivalent cation, and may be selected from the group including B, Al, Ga, In, Sc, Y, La and Gd, and other trivalent metal ions. A comprises a luminescence activator doped in the crystal structure at a concentration level from about 0.001 mol % to about 20 mol %, preferably from about 0.1 mol % to about 10 mol %, relative to M(II) and M(I). A can be at least one ion selected from the group including Ce, Pr, Nd, Sm, Eu, Gd, Tb, Dy, Ho, Er, Tm, Yb, Lu, Mn, Bi, Sb, preferably $Eu^{2+}$, $Ce^{3+}$, $Tb^{3+}$, $Yb^{2+}$ and $Mn^{2+}$.

In certain embodiments, the present invention is directed to a novel family of oxycarbonitride based phosphors expressed by:

$$M(II)_{7-y}M(I)_yM(III)_{12-x-y-z}Si_{x+y+z}O_{25-x\pm 3\delta/2}N_{x\pm\delta-z}C_z:A \quad (5)$$

and $$M(II)_{7-y}M(I)_yM(III)_{12-x-y-z}Si_{x+y+z}O_{25-x\pm\delta/2}N_{x\pm\delta-z}C_{z\pm\delta/2}:A \quad (5a)$$

wherein $0<x<12$, $0\leq y<x$, $0<z<x$, $0<x+y+z\leq 12$, $z<x+\delta$, and $0<\delta\leq 3$. M(II) comprises at least one divalent cation, and may be selected from the group including Be, Mg, Ca, Sr, Ba, Cu, Co, Ni, Pd, Zn, Cd and other divalent transition metal ions. M(I) comprises at least one monovalent cation, and may be selected from the group including Li, Na, K, Rb, Cu, Ag and Au, M(III) comprises at least one trivalent cation, and may be selected from the group including B, Al, Ga, In, Sc, Y, La and Gd, and other trivalent metal ions. A comprises a luminescence activator doped in the crystal structure at a concentration level from about 0.001 mol % to about 20 mol %, preferably from about 0.1 mol % to about 10 mol %, relative to M(II) and M(I). A can be at least one ion selected from the group including Ce, Pr, Nd, Sm, Eu, Gd, Tb, Dy, Ho, Er, Tin, Yb, Lu, Mn, Bi, Sb, preferably $Eu^{2+}$, $Ce^{3+}$, $Tb^{3+}$, $Yb^{2+}$ and $Mn^{2+}$.

In certain embodiments, the present invention is directed to a novel family of oxycarbonitride based phosphors expressed by:

$$M(II)_{7-y}M(I)_yM(III)_{12-x-y-z}Si_{x+y+z}O_{25-x-v/2\pm 3\delta/2}N_{x\pm\delta-z}C_zD_v:A \quad (6)$$

and $$M(II)_{7-y}M(I)_yM(III)_{12-x-y-z}Si_{x+y+z}O_{25-x-v/2\pm\delta/2}N_{x\pm\delta-z}C_{z\pm\delta/2}D_v:A \quad (6a)$$

wherein $0<x<12$, $0\leq y<1$, $0<z<x$, $z<x+\delta$, $0<\delta\leq 3$, $0\leq v<1$, and $0<x+y+z\leq 12$. M(II) comprises at least one divalent cation, and may be selected from the group including Be, Mg, Ca, Sr, Ba, Cu, Co, Ni, Pd, Zn, Cd and other divalent transition metal ions. M(I) comprises at least one monovalent cation, and may be selected from the group including Li, Na, K, Rb, Cu, Ag and Au. M(III) comprises at least one trivalent cation, and may be selected from the group including B, Al, Ga, In, Sc, Y, La and Gd, and other trivalent metal ions. D comprises at least one monovalent anion, and may be selected from the group including F, Cl, Br and I. A comprises luminescence activator doped in the crystal structure at a concentration level from about 0.001 mol % to about 20 mol %, preferably from about 0.1 mol % to about 10 mol %, relative to M(II) and M(I). A can be at least one ion selected from the group including Ce, Pr, Nd, Sm, Eu, Gd, Tb, Dy, Ho, Er, Tm, Yb, Lu, Mn, Bi, Sb, preferably $Eu^{2+}$, $Ce^{3+}$, $Tb^{3+}$, $Yb^{2+}$ and $Mn^{2+}$.

In some embodiments, the present invention is directed to a composition (1) comprising a phosphor having the formula $M(II)_aSi_bO_cN_dC_e:A$, wherein: $6<a<8$, $8<b<14$, $13<c<17$, $5<d<9$, and $0<e<2$; M(II) comprises at least one divalent cation; and A comprises a luminescence activator doped in the host crystal of the phosphor. In some embodiments, M(II) comprises at least one divalent cation selected from the group consisting of Be, Mg, Ca, Sr, Ba, Cu, Co, Ni, Pd, Zn, and Cd. In further embodiments, M(II) comprises two or more different divalent cations. In certain embodiments, A comprises a luminescence activator selected from the group consisting of Ce, Pr, Nd, Sm, Eu, Gd, Tb, Dy, Ho, Er, Tm, Yb, Lu, Mn, Bi, and Sb. In further embodiments, A is doped in the host crystal of the phosphor at a concentration level of from about 0.001 mol % to about 20 mol % relative to M(II). The mol % of A can be adjusted in increments of 0.0001 within this range. In some embodiments, A is doped in the host crystal of the phosphor at a concentration level of from about 0.01 mol % to about 10 mol %. In further embodiments, A is doped in the host crystal of the phosphor at a concentration level of from about 0.10 mol % to about 5 mol %.

In certain embodiments, the phosphor of composition (1) comprises a first crystalline phase. In further embodiments, the first crystalline phase is an orthorhombic crystal system or a triclinic crystal system. In some embodiments, it is possible that the same first crystalline phase can be classified as either orthorhombic or triclinic with similar certainty. In some embodiments, the phosphor consists of only a single crystalline phase. In certain embodiments, the phosphor does not comprise any other crystalline phase. In other embodiments, the phosphor comprises at least a first crystalline phase and a second crystalline phase. In some embodiments, the first crystalline phase is an orthorhombic crystal system and the second crystalline phase is a triclinic crystal system belonging to space group P1 (No. 1). In other embodiments, the first crystalline phase is a triclinic crystal system and the second crystalline phase is a triclinic crystal system belonging to space group P1 (No. 1) which may be different from the first crystalline phase.

In some embodiments, the phosphor composition (1) comprises a crystalline phase that is an orthorhombic crystal system, wherein: the unit cell parameter a of the host crystal is from about 11.071 Å to about 11.471 Å; the unit cell parameter b of the host crystal is from about 8.243 Å to about 8.643 Å; and the unit cell parameter c of the host crystal is from about 7.667 Å to about 8.067 Å. Within each of these ranges, the unit cell parameters can vary in increments of 0.001. In some embodiments, the unit cell parameter a of the host crystal is from about 11.171 Å to about 11.371 Å; the unit cell parameter b of the host crystal is from about 8.343 Å to about 8.543 Å; and the unit cell parameter c of the host crystal is from about 7.767 Å to about 7.967 Å. In other embodiments, the unit cell parameter a of the host crystal is from about 11.271 Å to about 11.371 Å; the unit cell parameter b of the host crystal is from about 8.443 Å to about 8.543 Å; and the unit cell parameter c of the host crystal is from about 7.867 Å to about 7.967 Å. In other embodiments, the unit cell parameter a of the host crystal is from about 11.221 Å to about 11.321 Å; the unit cell parameter b of the host crystal is from about 8.393 Å to about 8.493 Å; and the unit cell parameter c of the host crystal is from about 7.817 Å to about 7.917 Å. In preferred embodiments, the unit cell parameter a of the host crystal is from about 11.271 Å to about 11.301 Å; the unit cell parameter b of the host crystal is from about 8.383 Å to about 8.453 Å; and the unit cell parameter c of the host crystal is from about 7.807 Å to about 7.907 Å.

In other embodiments, the phosphor composition (1) comprises a crystalline phase that is a triclinic crystal system, wherein: the unit cell parameter a of the host crystal is from about 11.049 Å to about 11.449 Å; the unit cell parameter b of the host crystal is from about 8.231 Å to about 8.631 Å; the unit cell parameter c of the host crystal is from about 7.662 Å to about 8.062 Å; the unit cell parameter α of the host crystal is from about 87 degrees to about 93 degrees; the unit cell parameter β of the host crystal is from about 87 degrees to about 93 degrees; and the unit cell parameter γ of the host crystal is from about 87 to about 93 degrees. Within each of the ranges for unit cell parameters a, b, and c, the unit cell parameter can vary in increments of 0.001. Within the ranges for unit cell parameters α, β, and γ, the unit cell parameter can vary in increments of 0.01. In some embodiments, the unit cell parameter a of the host crystal is from about 11.149 Å to about 11.349 Å; the unit cell parameter b of the host crystal is from about 8.331 Å to about 8.531 Å; the unit cell parameter c of the host crystal is from about 7.762 Å to about 7.962 Å; the unit cell parameter α of the host crystal is from about 89 degrees to about 91 degrees; the unit cell parameter β of the host crystal is from about 89 degrees to about 91 degrees; and the unit cell parameter γ of the host crystal is from about 89 to about 91 degrees. In some embodiments, the unit cell parameter a of the host crystal is from about 11.249 Å to about 11349 Å; the unit cell parameter b of the host crystal is from about 8.431 Å to about 8.531 Å; the unit cell parameter c of the host crystal is from about 7.862 Å to about 7.962 Å; the unit cell parameter α of the host crystal is from about 89.5 degrees to about 90.5 degrees; the unit cell parameter β of the host crystal is from about 89.5 degrees to about 90.5 degrees; and the unit cell parameter γ of the host crystal is from about 89.5 to about 90.5 degrees. In some embodiments, the unit cell parameter a of the host crystal is from about 11.199 Å to about 11.299 Å; the unit cell parameter b of the host crystal is from about 8.381 Å to about 8.481 Å; the unit cell parameter c of the host crystal is from about 7.812 Å to about 7.912 Å; the unit cell parameter α of the host crystal is from about 89.5 degrees to about 90.5 degrees; the unit cell parameter β of the host crystal is from about 89.5 degrees to about 90.5 degrees; and the unit cell parameter γ of the host crystal is from about 89.5 to about 90.5 degrees. In preferred embodiments, the unit cell parameter α of the host crystal is from about 89.5 degrees to about 89.9 degrees; the unit cell parameter β of the host crystal is from about 89.5 degrees to about 89.9 degrees; and the unit cell parameter γ of the host crystal is from about 89.5 to about 89.9 degrees.

In certain embodiments, the phosphor composition (1) further comprises one or more additional phosphors. In some embodiments, the phosphor composition further comprises at least one phosphor selected from the group consisting of: $Ca_{1-x}Al_{x-xy}Si_{1-x+xy}N_{2-x-xy}C_{xy}$:A; $Ca_{1-x-z}Na_zM(III)_{x-xy-z}Si_{1-x+xy+z}N_{2-x-xy}C_{xy}$:A; $M(II)_{1-x-z}M(I)_zM(III)_{x-xy-z}Si_{1-x+xy+z}N_{2-x-xy}C_{xy}$:A; $M(II)_{1-x-z}M(I)_zM(III)_{x-xy-z}Si_{1-x+xy+z}N_{2-x-xy-2w/3}C_{xy}O_{w-v/2}D_v$:A; and $M(II)_{1-x-z}M(I)_zM(III)_{x-xy-z}Si_{1-x+xy+z}N_{2-x-xy-2w/3-v/3}C_{xy}O_wD_v$:A; wherein $0<x<1$, $0<y<1$, $0\leq z<1$, $0\leq v<1$, $0<w<1$, $x+z<1$, $x>xy+z$, $v/2\leq w$, $x-xy-2w/3-v/3<2$, and $0<x-xy-z<1$; M(II) is at least one divalent cation; M(I) is at least one monovalent cation; M(III) is at least one trivalent cation; D is at least one monovalent anion; and A is a luminescence activator.

In certain embodiments, the present invention is directed to a composition (2) comprising a phosphor having the formula $M(II)_7Al_{12-x-y}Si_{x+y}O_{25-x}N_{x-y}C_y$:A, wherein; $0<x\leq 12$, $0<y<x$, and $0<x+y\leq 12$; M(II) comprises at least one divalent cation; and A comprises a luminescence activator doped in the crystal structure. In certain embodiments, M(II) comprises at least one divalent cation selected from the group consisting of Be, Mg, Ca, Sr, Ba, Cu, Co, Ni, Pd, Zn, and Cd. In some embodiments, M(II) comprises two or more different divalent cations. In further embodiments, A comprises a luminescence activator that is selected from the group consisting of Ce, Pr, Nd, Sm, Eu, Gd, Tb, Dy, Ho, Er, Tm, Yb, Lu, Mn, Bi, and Sb. In some embodiments, A is doped in the host crystal of the phosphor at a concentration level of 0.001 mol % to 20 mol % relative to M(II). The mol % of A can be adjusted in increments of 0.0001 within this range. In some embodiments, A is doped in the host crystal of the phosphor at a concentration level of from about 0.01 mol % to about 10 mol %. In further embodiments, A is doped in the host crystal of the phosphor at a concentration level of from about 0.10 mol % to about 5 mol %.

In some embodiments, the phosphor of composition (2) comprises a crystalline phase that is a triclinic crystal system belonging to space group P1 (No. 1). In some embodiments, the phosphor consists of only a single crystalline phase. In certain embodiments, the phosphor does not comprise any other crystalline phase. In other embodiments, the phosphor comprises at least a first crystalline phase and a second crystalline phase. In certain embodiments, the first crystalline phase is an orthorhombic crystal system and the second crystalline phase is a triclinic crystal system belonging to space group P1 (No. 1). In other embodiments, the first crystalline phase is a triclinic crystal system and the second crystalline phase is a triclinic crystal system belonging to space group P1 (No. 1) which may be different than the first crystalline phase. In some embodiments, it is possible for the same crystalline phase to be classified as either orthorhombic or triclinic with similar certainty.

In certain embodiments, the phosphor composition (2) comprises a crystalline phase that is a triclinic crystal system belonging to space group P1 (No, 1), wherein the unit cell parameter a of the host crystal is from about 6.9011 Å to about 7.3011 Å; the unit cell parameter b of the host crystal is from about 7.0039 Å to about 7.4039 Å; the unit cell parameter c of the host crystal is from about 7.0728 Å to about 7.4728 Å; the unit cell parameter α of the host crystal is from about 85 degrees to about 92 degrees; the unit cell parameter β of the host crystal is from about 81 degrees to about 88 degrees; and the unit cell parameter γ of the host crystal is from about 72 degrees to about 79 degrees. Within each of the ranges for unit cell parameters a, b, and c, the unit cell parameter can vary in increments of 0.0001. Within the ranges for unit cell parameters α, β, and γ, the unit cell parameter can vary in increments of 0.001. In certain embodiments, the unit cell parameter a of the host crystal is from about 7.0011 Å to about 7.2011 Å; the unit cell parameter b of the host crystal is from about 7.1039 Å to about 7.3039 Å; the unit cell parameter c of the host crystal is from about 7.1728 Å to about 7.3728 Å; the unit cell parameter α of the host crystal is from about 87 degrees to about 90 degrees; the unit cell parameter β of the host crystal is from about 83 degrees to about 86 degrees; and the unit cell parameter γ of the host crystal is from about 74 degrees to about 77 degrees. In certain embodiments, the unit cell parameter a of the host crystal is from about 7.0511 Å to about 7.1511 Å; the unit cell parameter b of the host crystal is from about 7.1539 Å to about 7.2539 Å; the unit cell parameter c of the host crystal is from about 7.2228 Å to about 7.3228 Å; the unit cell parameter α of the host crystal is from about 88.431 degrees to about 89.431 degrees; the unit cell parameter β of the host crystal is from about 84.415 degrees to about 84.515 degrees; and the unit cell parameter γ of the host crystal is from about 75.593 degrees to about 76.593 degrees. In preferred embodiments, the unit cell parameter α of the host crystal is from about 88.9 degrees to about 89.9 degrees; the unit cell parameter β of the host crystal is from about 84.5 degrees to about 85.0 degrees; and the unit cell parameter γ of the host crystal is from about 75.6 to about 76.5 degrees.

To certain embodiments, the phosphor composition (2) comprises one or more additional phosphors. In some embodiments, the composition further comprises at least one phosphor selected from the group consisting of: $Ca_{1-x}Al_{x-xy}Si_{1-x+xy}N_{2-x-xy}C_{xy}$:A; $Ca_{1-x-z}Na_zM(III)_{x-xy-z}Si_{1-x+xy+z}N_{2-x-xy}C_{xy}$:A; $M(II)_{1-x-z}M(I)_zM(III)_{x-xy-z}Si_{1-x+xy+z}N_{2-x-xy}C_{xy}$:A; $M(II)_{1-x-z}M(I)_zM(III)_{x-xy-z}Si_{1-x+xy+z}N_{2-x-xy-2w/3}C_{xy}O_{w-v/2}D_v$:A; and $M(II)_{1-x-z}M(I)_zM(III)_{x-xy-z}Si_{1-x+xy+z}N_{2-x-xy-2w/3-v/3}C_{xy}O_wD_v$:A; wherein $0<x<1$, $0<y<1$, $0\leq z<1$, $0\leq v<1$, $0<w<1$, $x+z<1$, $x>xy+z$, $v/2\leq w$, $x-xy-2w/3-v/3<2$, and $0<x-xy-z<1$; M(II) is at least one divalent cation; M(I) is at least one monovalent cation; M(III) is at least one trivalent cation; D is at least one monovalent anion; and A is a luminescence activator.

In certain embodiments, the present invention is directed to a composition (3, 4, 4a, 5, 5a, 6, or 6a) comprising a phosphor having a formula selected from the group consisting of:

$$M(II)_7M(III)_{12-x-y}Si_{x+y}O_{25-x}N_{x-y}C_y:A, \quad (a)$$

wherein $0<x\leq 12$, $0<x+y\leq 12$, and $0<y<x$;

$$M(II)_7M(III)_{12-x-y}Si_{x+y}O_{25-x\pm\delta/2}N_{x\pm\delta-y}C_y:A, \quad (b)$$

wherein $0<x<12$, $0\leq y<x$, $0<x+y\leq 12$, $0<\delta\leq 3$, and $\delta<x+y$;

$$M(II)_7M(III)_{12-x-y}Si_{x+y}O_{25-x\pm\delta/2}N_{x\pm\delta-y}C_{y\pm\delta/2}:A, \quad (c)$$

wherein $0<x<12$, $0\leq y<x$, $<x+y\leq 12$, $0<\delta\leq 3$, and $\delta<x+y$;

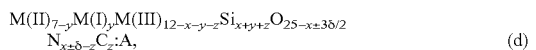
(d)

wherein $0<x<12$, $0\leq y<x$, $0<z<x$, $0<x+y+z\leq 12$, $z<x+\delta$, and $0<\delta\leq 3$;

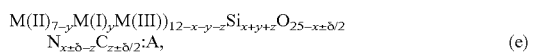
(e)

wherein $0<x<12$, $0\leq y<x$, $0<z<x$, $z<x+\delta$, $0<x+y+z\leq 12$, and $0<\delta\leq 3$;

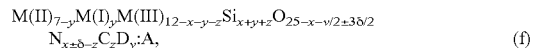
(f)

wherein $0<x<12$, $0\leq y<1$, $0<z<x$, $z<x+\delta$, $0<\delta\leq 3$, $0\leq v<1$, and $0<x+y+z\leq 12$; and

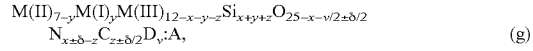
(g)

wherein $0<x\leq 12$, $0\leq y<1$, $0<z<x$, $z<x+\delta$, $0<\delta\leq 3$, $0\leq v<1$, and $0<x+y+z\leq 12$;

wherein:
M(II) comprises at least one divalent cation;
M(I) comprises at least one monovalent cation;
M(III) comprises at least one trivalent cation;
D comprises at least one monovalent anion; and
A comprises a luminescence activator doped in the crystal structure.

In certain embodiments of the composition (3, 4, 4a, 5, 5a, 6, or 6a), M(II) comprises at least one divalent cation selected from the group consisting of Be, Mg, Ca, Sr, Ba, Cu, Co, Ni, Pd, Zn, and Cd; M(III) comprises at least one trivalent cation selected from the group consisting of B, Al, Ga, In, Sc, Y, La and Gd; M(I) comprises at least one monovalent cation selected from the group consisting of Li, Na, K, Rb, Cu, Ag and Au; and D comprises at least one monovalent anion selected from the group consisting of F, Cl, Br and I. In some embodiments, A comprises at least one luminescence activator selected from the group consisting of Ce, Pr, Nd, Sm, Eu, Gd, Tb, Dy, Ho, Er, Tm, Yb, Lu, Mn, Bi, and Sb. In further embodiments, A is doped in the host crystal of the phosphor at the concentration level of 0.001 mol % to 20 mol % relative to M(II) and M(I). The mol % of A can be adjusted in increments of 0.0001 within this range. In some embodiments, A is doped in the host crystal of the phosphor at a concentration level of from about 0.01 mol % to about 10 mol %. In further embodiments, A is doped in the host crystal of the phosphor at a concentration level of from about 0.10 mol % to about 5 mol %.

In some embodiments, the phosphor composition (3, 4, 4a, 5, 5a, 6, or 6a) comprises a crystalline phase that is a triclinic crystal system belonging to space group P1 (No. 1). In some embodiments, the phosphor consists of only a single crystalline phase. In certain embodiments, the phosphor does not comprise any other crystalline phase. In other embodiments, the phosphor comprises at least a first crystalline phase and a second crystalline phase. In certain embodiments, the first crystalline phase is an orthorhombic crystal system and the second crystalline phase is a triclinic crystal system belonging to space group P1 (No. 1). In other embodiments, the first crystalline phase is a triclinic crystal system and the second crystalline phase is a triclinic crystal system belonging to space group P1 (No. 1) that may be different from the first crystalline phase. In some embodiments, it is possible for the same crystalline phase to be classified as either orthorhombic or triclinic with similar certainty.

In certain embodiments, the phosphor composition (3, 4, 4a, 5, 5a, 6, or 6a) further comprises one or more additional phosphors. In some embodiments, the composition further comprises at least one phosphor selected from the group consisting of: $C_{1-x}Al_{x-xy}Si_{1-x+xy}N_{2-x-xy}C_{xy}$:A; $Ca_{1-x-z}Na_zM(III)_{x-xy-z}Si_{1-x+xy+z}N_{2-x-xy}C_{xy}$:A; $M(II)_{1-x-z}M(I)_z(III)_{x-xy-z}Si_{1-x+xy+z}N_{2-x-xy}C_{xy}$:A; $M(II)_{1-x-z}M(I)_zM(II)_{x-xy-z}Si_{1-x+xy+z}N_{2-x-xy-2w/3}C_{xy}O_{w-v/2}D_v$:A; and $M(II)_{1-x-z}M(I)_zM(III)_{x-xy-z}Si_{1-x+xy+z}N_{2-x-xy-2w/3-v/3}C_{xy}O_wD_v$:A; wherein $0<x<1$, $0<y<1$, $0\leq z<1$, $0\leq v<1$, $0<w<1$, $x+z<1$, $x>xy+z$, $v/2\leq w$, $x-xy-2w/3-v/3<2$, and $0<x-xy-z<1$; M(II) is at least one divalent cation; M(I) is at least one monovalent cation; M(III) is at least one trivalent cation; D is at least one monovalent anion; and A is a luminescence activator.

In certain embodiments, the present invention is directed to a composition comprising a phosphor that comprises at least one carbon atom; at least one divalent cation M(II); at least one oxygen atom; and at least one nitrogen atom; wherein the phosphor comprises a first crystalline phase that is either an orthorhombic crystal system or a triclinic crystal system. In some embodiments, M(II) comprises at least one divalent cation selected from the group consisting of Be, Mg, Ca, Sr, Ba, Cu, Co, Ni, Pd, Zn, and Cd. In some embodiments, the phosphor further comprises a luminescence activator A doped in the host crystal of the phosphor at the concentration level of 0.001 mol % to 20 mol % relative to M(II). The mol % of A can be adjusted in increments of 0.001 within this range. In some embodiments, A is doped in the host crystal of the phosphor at a concentration level of from about 0.01 mol % to about 10 mol %. In further embodiments, A is doped in the host crystal of the phosphor at a concentration level of from about 0.10 mol % to about 5 mol %. In further embodiments, the phosphor further comprises at least a second crystalline phase. In some embodiments, the second crystalline phase is a triclinic crystal system belonging to space group P1 (No. 1). In certain embodiments, the phosphor emits light in a single emission spectrum from about 400 nm to about 650 nm when excited by a light source.

In certain embodiments, the present invention is directed to a light emitting device comprising: a light source emitting a first luminescence spectrum; and a phosphor composition, which, when irradiated with light from the light source, emits light having a second luminescence spectrum; wherein the phosphor composition comprises at least one phosphor selected from the group consisting of:

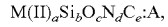 (a)

wherein 6<a<8, 8<b<14, 13<c<17, 5<d<9, 0<e<2;

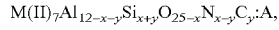 (b)

wherein 0<x≤12, 0<y<x, and 0<x+y≤12;

$M(II)_7M(III)_{12-x-y}Si_{x+y}O_{25-x}N_{x-y}C_y$:A, (c)

wherein 0<x≤12, 0<x+y≤12, and 0<y<x;

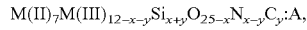 (d)

wherein 0<x<12, 0≤y<x, 0<x+y≤12, 0<δ≤3, and δ<x+y;

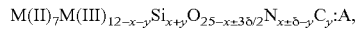 (e)

wherein 0<x<12, 0≤y<x, 0<x+y≤12, 0<δ≤3, and δ<x+y;

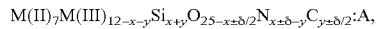 (f)

wherein 0<x<12, 0≤y<x, 0<z<x, 0<x+y+z≤12, z<x+δ, and 0<δ≤3;

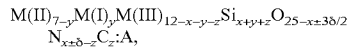 (g)

wherein 0<x<12, 0≤y<x, 0<z<x, 0<x+y+z≤12, z<x+δ, and 0<δ≤3;

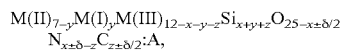 (h)

wherein 0<x<12, 0≤y<1, 0<z<x, z<x+δ, 0<δ≤3, 0≤v<1, and 0<x+y+z≤12; and

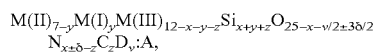 (i)

wherein 0<x<12, 0≤y<1, 0<z<x, z<x+δ, 0<δ≤3, 0≤v<1, and 0<x+y+z≤12;

wherein;
M(II) comprises at least one divalent cation;
M(I) comprises at least one monovalent cation;
M(III) comprises at least one trivalent cation;
D comprises at least one monovalent anion; and
A comprises a luminescence activator doped in the crystal structure.

In certain embodiments of the light emitting device, M(II) comprises at least one divalent cation selected from the group consisting of Be, Mg, Ca, Sr, Ba, Cu, Co, Ni, Pd, Zn, and Cd; M(I) comprises at least one monovalent cation selected from the group consisting of Li, Na, K, Rb, Cu, Ag and Au; M(III) comprises at least one trivalent cation selected from the group consisting of B, Al, Ga, In, Sc, Y, La and Gd; D comprises at least one anion selected from the group consisting of F, Cl, Br and I; and A comprises at least one luminescence activator selected from the group consisting of Ce, Pr, Nd, Sm, Eu, Gd, Tb, Dy, Ho, Er, Tri, Yb, Lu, Mn, Bi, and Sb. In some embodiments, A is doped in the host crystal of the phosphor at the concentration level of 0.001 mol % to 20 mol % relative to M(II). The mol % of A can be adjusted in increments of 0.0001 within this range. In some embodiments, A is doped in the host crystal of the phosphor at a concentration level of from about 0.01 mol % to about 10 mol %. In further embodiments, A is doped in the host crystal of the phosphor at a concentration level of from about 0.10 mol % to about 5 mol %.

In some embodiments, the first luminescence spectrum is from about 300 nm to about 600 nm. In further embodiments, the first luminescence spectrum is from about 400 to about 550 nm. In some embodiments, the light source is a light emitting diode or a laser diode. In certain embodiments, the device further comprises one or more additional phosphors. In some embodiments, an additional phosphor emits red light when excited by a light source. In certain embodiments, the light emitting device further comprises at least a second phosphor having a formula selected from the group consisting of $Ca_{1-x}Al_{x-xy}Si_{1-x+xy}N_{2-x-xy}C_{xy}$:A; $Ca_{1-x-z}Na_zM(III)_{x-xy-z}Si_{1-x+xy+z}N_{2-x-xy}C_{xy}$:A; $M(II)_{1-x-z}M(I)_zM(III)_{x-xy-z}Si_{1-x+xy+z}N_{2-x-xy}C_{xy}$:A; $M(II)_{1-x-z}M(I)_zM(III)_{x-xy-z}Si_{1-x+xy+z}N_{2-x-xy-2w/3}C_{xy}O_{w-v/2}D_v$:A; and $M(II)_{1-x-z}M(I)_xM(III)_{x-xy-z}Si_{1-x+xy+z}N_{2-x-xy-2w/3-v/3}C_{xy}O_wD_v$:A; wherein 0<x<1, 0<y<1, 0≤z<1, 0<v<1, 0<w<1, x+z<1, x>xy+z, v/2≤w, x-xy-2w/3-v/3<2, and 0<x-xy-z<1; M(II) is at least one divalent cation; M(I) is at least one monovalent cation; M(III) is at least one trivalent cation; D is at least one monovalent anion; and A is a luminescence activator. In further embodiments, the light emitting device further comprises at least two additional phosphors.

In certain embodiments, the light emitting device further comprises at least one additional phosphor that emits light having a peak in wavelength range from about 480 to about 660 nm when excited by a light source. In some embodiments, the device further comprise at least one additional phosphor that emits light having a peak in wavelength range from about 520 to about 640 nm when excited by a light source. In some embodiments, the device emits white light. In certain embodiments, the device emits cool white light. In other embodiments, the device emits warm white light. In further embodiments, the device emits green light having a wavelength value from about 480 nm to about 600 nm. In other embodiments, the device emits light having a wavelength value from about 500 nm to about 590 nm. In still other embodiments, the device emits light having a wavelength value from about 380 nm to about 750 nm. In further embodiments, the device emits light having a wavelength value from about 400 nm to about 700 nm.

In certain embodiments, the device further comprises at least one phosphor selected from the group consisting of $Ca_{1-x}Sr_xS:Eu^{2+}$ (0≤x≤1), $3.5MgO\cdot0.5MgF_2\cdot GeO_2:Mn^{4+}$, $Y_2O_2S:Eu^{3+}$, $M_2Si_5N_8:Eu^{2+}$ (M=Ca, Sr, Ba), $MAlSiN_3:Eu^{2+}$ (M=Ca, Sr), $Y_2Si_4N_6C:Eu^{2+}$, $CaSiN_2:Eu^{2+}$, $Ca_{1-x}Sr_xGa_2S4:Eu^{2+}$ (0≤x≤1), $Ca_{1-x-y-z}Mg_xSr_yBa_zSiO_4:Eu^{2+}$ (0≤x≤1, 0≤y≤1, 0≤z≤1, x+y+z≤1), $BaMgAl_{10}O_{17}:Eu^{2+}$, $Mn^{2+}$, $MYSi_4N_7:Eu^{2+}$ (M=Ca, Sr, Ba), β-sialon:$Eu^{2+}$, $MSi_2O_2N_2:Eu^{2+}$ (M=Ca, Sr, Ba), $Ba_3Si_6O_{12}N_2:Eu^{2+}$, $M_2Si_5N_8:Ce^{3+}$ (M=Ca, Sr, Ba), $Y_2Si_4N_6C:Ce^{3+}$, α-sialon:$Yb^{2+}$, $(MSiO_3)_m\cdot(SiO_2)_n:Eu^{2+}$, X (M=Mg, Ca, Sr, Ba; X=F, Cl, Br, I; m is 1 or 0, and either (i) n>3 if m=1 or (ii) n=1 if m=0), $MAl_2O_4:Eu^{2+}$ (M=Mg, Ca, Sr), $BaMgAl_{10}O_{17}:Eu^{2+}$, $Y_3Al_5O_{12}:Ce^{3+}$ (cerium-doped garnet type phosphor), and α-sialon:$Eu^{2+}$.

DEFINITIONS

As used herein, "activator" refers to the atomic or ionic species that emits light with the support of the host crystal. The activator may be doped in the host crystal in a very small amount, as further described herein. The activator can comprise a single element, such as, for example and without limitation, $Eu^{2+}$, or can comprise multiple elements (i.e. co-activators), such as, for example and without limitation, a combination of two or more of $Eu^{2+}$, $Ce^{3+}$, $Tb^{3+}$, $Yb^{2+}$ and $Mn^{2+}$.

As used herein, a "phosphor composition" refers to a composition comprising a phosphor having the ratio of atoms specified for the particular phosphor. It may or may not be stoichiometric proportions. Impurities and one or more crystalline phases may be present in the composition.

As used herein, "co-activator" refers to an additional activator in the same host crystal.

As used herein, "dopant" refers to an atomic or ionic species that is doped in a host crystal.

As used herein, "particle" refers to an individual crystal of phosphor.

As used herein, "grain" refers to an agglomeration, aggregation, polycrystalline or polymorph of phosphor particles, where the particles are not easily separated as compared to phosphor particles of a powder.

As used herein, the term "phosphor" refers to a phosphor in any appropriate form, such as a phosphor particle, a phosphor grain, or phosphor powder comprised of phosphor particles, grains, or a combination thereof.

As used herein, "light source" refers to any source of light capable of exciting or irradiating the phosphors of the present invention, including without limitation a Group III-V semiconductor quantum well-based light emitting diode, a laser diode, or a phosphor other than the phosphor of a light emitting device of the present invention. The light source of the present invention can either excite/irradiate the phosphor directly, or excite another system to thereby provide the excitation energy for the phosphor indirectly.

Temperatures described herein for processes involving a substantial gas phase are of the oven or other reaction vessel in question, not of the reactants per se.

"White light," as used herein, is light of certain chromaticity coordinate values (e.g., Commission Internationale de l'Éclairage (CIE)), which are well-known in the art. Correlated color temperature of a light source is the temperature of an ideal black-body radiator that radiates light of comparable hue to that light source. Higher color temperatures (5,000 K or more) are called cool colors (or "cool white"); lower color temperatures (2,700-3,000 K) are called warm colors (or "warm white").

Throughout the specification, reference may be made to M(I), M(II), and M(III), where M(I) is at least one monovalent cation, M(II) is at least one divalent cation, and M(III) is at least one trivalent cation. In addition to any values for these variables that may be given with respect to a particular formulation, M(II) may be selected from the group consisting of Be, Mg, Ca, Sr, Ba, Cu, Co, Ni, Pd, Zn, and Cd; M(I) may be selected from the group consisting of Li, Na, K, Rb, Cu, Ag and Au; and M(III) is selected from the group consisting of B, Al, Ga, In, Sc, Y, La and Gd.

For the purposes of the examples described herein, the quantum efficiency (QE) was measured against the same internal standard sample.

Unless defined otherwise, all technical and scientific terms used herein have the same meaning as commonly understood by one of ordinary skill in the art to which this invention belongs. All technical and scientific terms used herein have the same meaning when used. It must be noted that, as used herein and in the appended claims, the singular forms "a", "and", and "the" include plural references unless the context clearly dictates otherwise.

In the description of phosphor compositions, a conventional notation is used, wherein the chemical formula for the host crystal is given first, followed by a colon and the formula for the activator and co-activator(s). In certain instances in this specification where the structure of a phosphor's host crystal is discussed, the activator(s) may not be included when referencing the phosphor's formulation.

BRIEF DESCRIPTION OF THE FIGURES

FIG. 2A depicts excitation (left curve) and emission (right curve) spectra of sample 1.1a.

FIG. 6 depicts the XRD patterns of phosphor compositions of Example 2a.

FIGS. 7A and 7B each depict a further view of the XRD patterns of phosphor compositions of Example 2a. FIG. 7A depicts a closer view in the 2θ=31.0-32.6 range. FIG. 7B depicts a closer view in the 2θ=28.0-28.8 range.

FIG. 14A depicts a closer view in the 2θ=31.0-32.4 degree range. FIG. 14B depicts a closer view of the 2θ=28.0-29.0 degree range.

DETAILED DESCRIPTION

Figure 1A:
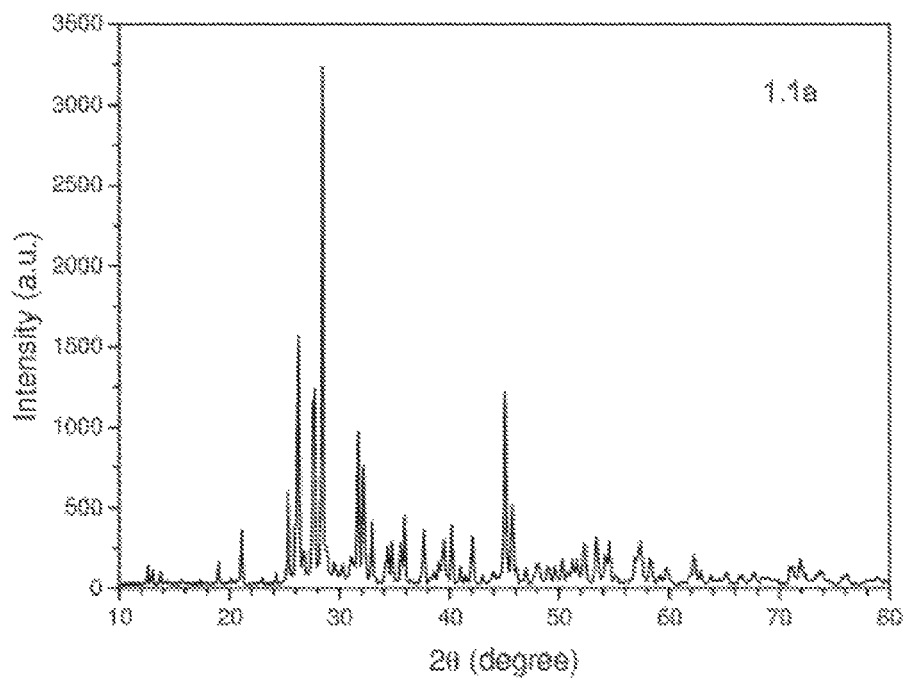
FIGS. 1A and 1B depict the XRD pattern of the phosphor compositions of samples 1.1a and 1.1b, respectively.

In certain embodiments, the present invention is directed to a novel family of oxycarbonitride phosphors expressed by:

$$M(II)_a Si_b O_c N_d C_e : A \qquad (1)$$

wherein $6<a<8$, $8<b<14$, $13<c<17$, $5<d<9$, $0<e<2$; preferably $6.5<a<7.5$, $8.5<b<12.5$, $14<c<16$, $6<d<7.5$, $0<e<1$. M(II) comprises at least one divalent cation, and may be selected from the group including Be, Mg, Ca, Sr, Ba, Cu, Co, Ni, Pd, Zn, Cd and other divalent transition metal ions. A comprises a luminescence activator doped in the crystal structure at the concentration level from about 0.001 mol % to about 20 mol %, preferably from about 0.1 mol % to about 10 mol %, relative to M(II). A can be at least one metal ion selected from the group including Ce, Pr, Nd, Sm, Eu, Gd, Tb, Dy, Ho, Er, Tm, Yb, Lu, Mn, Bi, Sb, preferably $Eu^{2+}$, $Ce^{3+}$, $Tb^{3+}$, $Yb^{2+}$ and $Mn^{2+}$.

These phosphors may contain a single crystalline phase, or, in the alternative, two or more crystalline phases. In certain embodiments, the phosphors of this family exhibit an orthorhombic crystalline phase or a triclinic crystal system. In other embodiments, the phosphors of this family exhibit a high proportion of an orthorhombic crystalline phase. In other embodiments, these phosphors exhibit a second triclinic crystalline phase belonging to space group P1 (No. 1).

In certain embodiments, the present invention is directed to a novel family of oxycarbonitride phosphors expressed by:

$$M(II)_7 Al_{12-x-y} Si_{x+y} O_{25-x} N_{x-y} C_y : A \qquad (2)$$

wherein $0<x\le12$, $0<y<x$, and $0<x+y\le12$. M(II) comprises at least one divalent cation, and may be selected from the group including Be, Mg, Ca, Sr, Ba, Cu, Co, Ni, Pd, Zn, Cd and other divalent transition metal ions. A comprises a luminescence activator doped in the crystal structure at the concentration level from about 0.001 mol % to about 20 mol %, preferably from about 0.1 mol % to about 10 mol %, relative to M(II). A can be at least one metal ion selected from the group including Ce, Pr, Nd, Sm, Eu, Gd, Tb, Dy, Er, Tm, Yb, Lu, Mn, Bi, Sb, preferably $Eu^{2+}$, $Ce^{3+}$, $Tb^{3+}$, $Yb^{2+}$ and $Mn^{2+}$.

Compositionally, the host crystalline substance of composition (2) would be the product of the cross substitution of Si—N bonds for Al—O bonds in the compound designated as $Sr_7Al_{12}O_{25}$. $Sr_7Al_{12}O_{25}$ is known to be crystallized in a trigonal crystal system with a space group of P-3. The Al—O bonds of $Sr_7Al_{12}O_{25}$ could be replaced by the Si—N bonds from the nitrogen source $Si_3N_4$ and $N_2$ in a solid state reaction at high temperature:

$$Sr_7Al_{12}O_{25} + xSi_3N_4 \rightarrow Sr_7Al_{12-x}Si_xO_{25-x}N_x$$

In theory, the structure of $Sr_7Al_{12}O_{25}$ remains when the substitution is in small portion, whereas the structure would change when a substantial amount of Al—O bonds are substituted by Si—N bonds. Furthermore, Al—N can be replaced by SiC, where Si occupies a site of Al, and C occupies a site of N in the starting composition expressed below:

$$M(II)_7 Al_{12-x} Si_x O_{25-x} N_x + y Si_3 N_4 \rightarrow M(II)_7 Al_{12-x-y} Si_{x+y} N_{x-y} C_y$$

It is also possible for C to occupy a site occupied by O or both O and N in the starting composition, i.e. $M(II)_7Al_{12-x}Si_xO_{25-x}N_x$, to form a composition $M(II)_7Al_{12-x-y}Si_xO_{25-x-2y}N_xC_y$, or $M(II)_7Al_{12-x-y}Si_xO_{25-x-y}N_{x-2/3y}C_y$ which represents that the C can occupy either O sites or N sites or both.

In certain embodiments, the phosphors of this family exhibit a single triclinic crystalline phase belonging to space group P1 (No. 1). In other embodiments, the phosphors of this family exhibit a high proportion of a triclinic crystalline phase belonging to space group P1 (No. 1). In other embodiments, these phosphors exhibit a second crystalline phase that can be classified as either an orthorhombic crystal system or a triclinic crystal system.

In certain embodiments, the present invention is directed to a novel family of oxycarbonitride phosphors expressed by:

$$M(II)_7 M(III)_{12-x-y} Si_{x+y} O_{25-x} N_{x-y} C_y : A \qquad (3)$$

wherein $0<x\le12$, $0<x+y\le12$, and $0<y<x$. M(II) comprises at least one divalent cation, and may be selected from the group including Be, Mg, Ca, Sr, Ba, Cu, Co, Ni, Pd, Zn, Cd and other divalent transition metal ions. M(III) comprises at least one trivalent cation, and may be selected from the group including B, Al, Ga, In, Sc, Y, La and Gd, and other trivalent metal ions. A comprises a luminescence activator doped in the crystal structure at the concentration level from about 0.001 mol % to about 20 mol %, preferably from about 0.1 mol % to about 10 mol %, relative to M(II). A can be at least one metal ion selected from the group including Ce, Pr, Nd, Sm, Eu, Gd, Tb, Dy, Ho, Er, Tm, Yb, Lu, Mn, Bi, Sb, preferably $Eu^{2+}$, $Ce^{3+}$, $Tb^{3+}$, $Yb^{2+}$ and $Mn^{2+}$.

In certain embodiments, the present invention is directed to a novel family of oxycarbonitride based phosphors expressed by:

$$M(II)_7 M(III)_{12-x-y} Si_{x+y} O_{25-x\pm3\delta/2} N_{x\pm\delta-y} C_y : A \qquad (4)$$

wherein $0<x<12$, $0\le y<x$, $0<x+y\ 12$, $0<\delta\le3$, and $\delta<x+y$. M(II) comprises at least one divalent cation, and may be selected from the group including Be, Mg, Ca, Sr, Ba, Cu, Co, Ni, Pd, Zn, Cd and other divalent transition metal ions. M(III) comprises at least one trivalent cation, and may be selected from the group including B, Al, Ga, In, Sc, Y, La and Gd, and other trivalent metal ions. A comprises a luminescence activator doped in the crystal structure at a concentration level from about 0.001 mol % to about 20 mol %, preferably from about 0.1 mol % to about 10 mol %, relative to M(II). A can be at least one ion selected from the group including Ce, Pr, Nd, Sm, Eu, Gd, Tb, Dy, Ho, Er, Tm, Yb, Lu, Mn, Bi, Sb, preferably $Eu^{2+}$, $Tb^{3+}$, $Yb^{2+}$ and $Mn^{2+}$.

In the phosphor of composition (4), O and N atoms can be exchanged with one another in a ratio of 1.5 (oxygen) to 1 (nitrogen), or $3\delta/2$ (oxygen) to $\delta$ (nitrogen). The replacement of O with N allows the Si atom to be coordinated with O and N atoms in varying ratios. It is pointed out, however, that the total number of the coordinated atoms does not remain constant, as O is replaced by N in composition (4), i.e., 1.5 O atoms replace 1 N atom. In order for the number of coordinated atoms (O, N and C) to remain constant, the composition can be expressed as follows:

$$M(II)_7M(III)_{12-x-y}Si_{x+y}O_{25-x\pm\delta/2}N_{x\pm\delta-y}C_{y\pm\delta/2}:A \quad (4a)$$

In certain embodiments, the present invention is directed to a novel family of oxycarbonitride phosphors expressed by:

$$M(II)_{7-y}M(I)_yM(III)_{12-x-y-z}Si_{x+y+z}O_{25-x\pm3\delta/2}N_{x\pm\delta-z}C_z:A \quad (5)$$

wherein $0<x<12$, $0 \le y<x$, $0<z<x$, $0<x+y+z \le 12$, $z<x+\delta$, and $0<\delta \le 3$. M(II) comprises at least one divalent cation, and may be selected from the group including Be, Mg, Ca, Sr, Ba, Cu, Co, Ni, Pd, Zn, Cd and other divalent transition metal ions. M(I) comprises at least one monovalent cation, and may be selected from the group including Li, Na, K, Rb, Cu, Ag and Au. M(III) comprises at least one trivalent cation, and may be selected from the group including B, Al, Ga, In, Sc, Y, La and Gd, and other trivalent metal ions. A comprises a luminescence activator doped in the crystal structure at a concentration level from about 0.001 mol % to about 20 mol %, preferably from about 0.1 mol % to about 10 mol %, relative to the total mol % of M(II) and M(I). A can be at least one ion selected from the group including Ce, Pr, Nd, Sm, Eu, Gd, Tb, Dy, Ho, Er, Tm, Yb, Lu, Mn, Bi, Sb, preferably $Eu^{2+}$, $Ce^{3+}$, $Tb^{3+}$, $Yb^{2+}$ and $Mn^{2+}$.

In the phosphor of composition (5), O and N atoms can be exchanged with one another in a ratio of 1.5 (oxygen) to 1 (nitrogen), or $3\delta/2$ (oxygen) to $\delta$ (nitrogen). The replacement of O with N allows the Si atom to be coordinated with O and N atoms in varying ratios. However, the total number of the coordinated atoms does not remain constant, as O is replaced by N in composition (5), i.e., 1.5 O atoms replace 1 N atom. In order for the number of coordinated atoms (O, N and C) to remain constant, the composition can be expressed as follows:

$$M(II)_{7-y}M(I)_yM(III)_{12-x-y-z}Si_{x+y+z}O_{25-x\pm\delta/2}N_{x\pm\delta-z}C_{z\pm\delta/2}:A \quad (5a)$$

In certain embodiments, the present invention is directed to a novel family of oxycarbonitride phosphors expressed by:

$$M(II)_{7-y}M(I)_yM(III)_{12-x-y-z}Si_{x+y+z}O_{25-x-v/2\pm3\delta/2}N_{x\pm\delta-z}C_zD_v:A \quad (6)$$

wherein $0<x<12$, $0 \le y<1$, $0<z<x$, $z<x+\delta$, $0<\delta \le 3$, $0 \le v<1$, and $0<x+y+z \le 12$. M(II) comprises at least one divalent cation, and may be selected from the group including Be, Mg, Ca, Sr, Ba, Cu, Co, Ni, Pd, Zn, Cd and other divalent transition metal ions, M(I) comprises at least one monovalent cation, and may be selected from the group including Li, Na, K, Rb, Cu, Ag and Au. M(III) comprises at least one trivalent cation, and may be selected from the group including B, Al, Ga, In, Sc, Y, La and Gd, and other trivalent metal ions. D comprises at least one monovalent anion, and may be selected from the group including F, Cl, Br and I. A comprises a luminescence activator doped in the crystal structure at a concentration level from about 0.001 mol % to about 20 mol %, preferably from about 0.1 mol % to about 10 mol %, relative to the total mol % of M(II) and M(I). A can be at least one ion selected from the group including Ce, Pr, Nd, Sm, Eu, Gd, Tb, Dy, Ho, Er, Tm, Yb, Lu, Mn, Bi, Sb, preferably $Eu^{2+}$, $Ce^{3+}$, $Yb^{2+}$ and $Mn^{2+}$.

In the phosphor of composition (6), oxygen and nitrogen atoms can be exchanged with one another in a ratio of 1.5 (oxygen) to 1 (nitrogen), or $3\delta/2$ (oxygen) to $\delta$ (nitrogen). The replacement of O with N allows the Si atom to be coordinated with O and N atoms in varying ratios. However, the total number of the coordinated atoms does not remain constant, as O is replaced by N in composition (6), i.e., 1.5 O atoms replace 1 N atom. In order for the number of coordinated atoms (O, N and C) to remain constant, the composition can be expressed as follows:

$$M(II)_{7-y}M(I)_yM(III)_{12-x-y-z}Si_{x+y+z}O_{25-x-v/2\pm\delta/2}N_{x\pm\delta-z}C_{z\pm\delta/2}D_v:A \quad (6a)$$

In certain embodiments, at least one of the phosphor compositions of the present invention is used as a wavelength converter for a light emitting device. The light emitting device has a first illuminant which emits light in a wavelength range from about 300 nm to about 600 nm, and a second illuminant which emits a visible light upon irradiation with light from the first illuminant, wherein the second illuminant contains at least one phosphor of the present invention. The first illuminant can, for example, emit light in a wavelength range from about 300 nm to about 600 nm, preferably from about 400 nm to 550 nm, and more preferably from about 420 nm to about 500 nm. In certain embodiments, the first illuminant is a laser diode or a light emitting diode (LED). When the second illuminant containing one or more phosphor compositions of the invention is irradiated with light from the first illuminant, it can, for example, emit light with a peak in wavelength range from about 460 nm to about 660 nm, preferably from about 480 nm to about 600 nm, and more preferably from about 500 nm to about 590 nm.

In certain embodiments, the second illuminant comprises at least one additional phosphor. The additional phosphor or phosphors can, for example, emit light having a peak in wavelength range from about 480 nm to about 660 nm, preferably from about 500 nm to about 650 nm, and more preferably from about 520 nm to about 640 nm.

In the phosphor compositions of the present invention, luminescence activator A can be doped in the host crystal of the phosphor either substitutionally or interstitially at a concentration level from about 0.001 mol % to about 20 mol % relative to the total mol % of the respective divalent and monovalent cations. In some embodiments, A is doped in the crystal structure of the phosphor at a concentration level from about 0.01 mol % to about 7 mol % relative to the total mol % of the divalent and monovalent cations. In other embodiments, A is doped in the crystal structure of the phosphor at a concentration level from about 0.05 mol % to about 5 mol % relative to the total mol % of the divalent and monovalent cations.

In certain embodiments, A comprises at least one co-activator. The co-activator may be selected from, but not limited to, the group including Ce, Pr, Nd, Sm, Eu, Gd, Tb, Dy, Ho, Er, Yb, Lu, Mn, Bi, Sb, preferably $Eu^{2+}$, $Ce^{3+}$, $Tb^{3+}$, $Yb^{2+}$ and $Mn^{2+}$, and the group including halogen anions, F, Cl, Br and I. The concentration level of the co-activator can be from about 0.001% to about 50% relative to the activator.

In certain embodiments, the phosphor compositions of the present invention comprise at least one crystalline phase which is a triclinic crystal system belonging to space group P1

(No. 1), an orthorhombic crystal system, or another triclinic crystal system. In certain embodiments, the phosphor compositions of the present invention comprise at least two different crystalline phases selected from the following: a triclinic crystal system belonging to space group P1 (No. 1), an orthorhombic crystal system, and another triclinic system. In certain embodiments, it is possible that a crystalline phase can be classified as either orthorhombic or triclinic with similar certainty.

In certain embodiments, the phosphor compositions of the present invention maintain at least 70% of their relative emission intensity at temperatures up to 250° C. In other embodiments, the phosphor compositions of the present invention maintain at least 85% of their relative emission intensity at temperatures up to 250° C. In other embodiments, the phosphor compositions of the present invention maintain at least 90% of their relative emission intensity at temperatures up to 250° C. In certain embodiments, the phosphor compositions of the present invention maintain at least 70% of their relative emission intensity at temperatures up to 200° C. In certain embodiments, the phosphor compositions of the present invention maintain at least 85% of their relative emission intensity at temperatures up to 200° C. In other embodiments, the phosphor compositions of the present invention maintain at least 90% of their relative emission intensity at temperatures up to 200° C. In further embodiments, the phosphor compositions of the present invention maintain at least 90% of the relative emission intensity at temperatures up to 150° C. In other embodiments, the phosphor compositions of the present invention maintain at least 95% of their relative emission intensity at temperatures up to 150° C.

In certain embodiments, the median diameter of the phosphor particles of the present invention can be from about 2 to about 50 microns, preferably from about 4 to about 30 microns, and more preferably from about 5 to about 20 microns. In some embodiments, the phosphor is a grain. In other embodiments, the phosphor is a particle.

In certain embodiments, the present invention further provides a light emitting device comprising: a light source emitting light of wavelengths from about 200 to about 600 nm, preferably from about 350 to about 490 nm; and at least one phosphor of the present invention, where the phosphor is positioned to absorb at least a portion of the light output from the light source and effectively modifies the color of the light absorbed from the light source, resulting in an emission of a longer wavelength than that of the light absorbed from the light source. For example, the phosphor compositions of the present invention can be mixed with a silicone resin to form a slurry. The phosphor-filled silicone can be applied to a LED chip as shown in FIGS. 20-23. The LED emits light in the near ultraviolet (nUV) range (e.g., about 405 nm) or the blue range (e.g., about 450 nm).

The light source used in the present invention, can, for example, comprise a gallium nitride-based LED with a light-emitting layer comprising a quantum well structure. The light emitting device can include a phosphor of the present invention and a reflector located so as to direct light from the LED or the phosphor (see FIG. 20). The phosphor of the present invention can be located on the surface of the LED (FIGS. 20 and 21) or separated therefrom (FIG. 22). The light emitting device can further include a translucent material encapsulating the LED and the phosphor as seen in FIGS. 20-23.

In certain embodiments, the light emitting device of the present invention comprises a light source, such as a LED, to either create excitation energy, or to excite another system to thereby provide the excitation energy for the phosphor of the present invention. Devices using the present invention can include, for example, and without limitation, white light producing light emitting devices, indigo light producing light emitting devices, blue light producing light emitting devices, green light producing light emitting devices, yellow light producing light emitting devices, orange light producing light emitting devices, pink light producing light emitting devices, red light producing light emitting devices, or light emitting devices with an output chromaticity defined by the line between the chromaticity of a phosphor of the present invention and that of at least one second light source. Headlights or other navigation lights for vehicles can be made with the light emitting devices of the present invention. The light emitting devices can be output indicators for small electronic devices, such as cell phones and personal digital assistants (PDAs). The light emitting devices of the present invention also can be the backlights of the liquid crystal displays for TV, cell phones, PDAs and laptop computers. Luminaires for general illumination purpose can also be made with the lighting devices of the present invention. Given appropriate power supplies, room lighting can be based on devices of the invention. The warmth (i.e., amount of yellow/red chromaticity) of light emitting devices of the present invention can be manipulated by selection of the ratio of light from a phosphor of the present invention to light from a second source (including, a second phosphor). Semiconductor light source-based white light devices can be used, for example, in a self-emission type display for displaying a predetermined pattern or a graphic design on a display portion of an audio system, a household appliance, a measuring instrument, a medical appliance, and the like. Such semiconductor light source-based light devices also can be used, for example, and without limitation, as light sources of a back-light for a liquid crystal diode (LCD) display, a printer head, a facsimile, a copying apparatus, and the like.

Suitable semiconductor light sources for use in the present invention also are any that create light that excites the phosphor compositions of the present invention, or that excites a different phosphor that in turn excites the phosphors of the present invention. Such semiconductor light sources can be, for example, and without limitation, light sources including: GaN (gallium nitride) type semiconductor light sources; In—Al—Ga—N type semiconductor light sources, such as $In_iAl_jG_kN$, where i+j+k=about 1, and where one or more of i, j and k can be 0; BN; SiC; ZnSe; $B_iAl_jGa_kN$, where i+j+k=about 1, and where one or more of i, j, and k can be 0; and $B_iIn_jAl_kGa_lN$, where i+j+k+l=about 1, and where one or more of i, j, k, and l can be 0; and other such similar light sources. The semiconductor light source (e.g., a semiconductor chip) can be based, for example, on III-V or II-VI quantum well structures (meaning structures comprising compounds that combine elements of the periodic table of the chemical elements from Group III with those from Group V or elements from Group II with those from Group VI). In certain embodiments, a blue or a near ultraviolet (nUV) emitting semiconductor light source is used.

In certain embodiments, the phosphor compositions of the present invention can be excited by light from a primary light source, such as, for example, a semiconductor light source (e.g., a LED) emitting in the wavelength range of about 300 to about 500 nm, from about 350 nm to about 480 nm or about 330 nm to about 390 nm, or from a secondary light source, such as, emissions from other phosphor(s) that emit in the wavelength range of about 300 nm to about 500 nm or about 350 nm to about 420 nm. Where the excitation light is secondary, in relation to the phosphor compositions of the present invention, the excitation-induced light is the relevant source light. Devices that use the phosphor compositions of the present invention can include, for example, and without limitation, mirrors, such as, dielectric mirrors, which direct light produced by the phosphor compositions of the present invention to the light output, rather than direct such light to the interior of the device (such as, the primary light source).

The light source (e.g., a LED) can, in certain embodiments, emit light of at least about 200 nm, at least about 250 nm, at least about 255 nm, at least about 260 nm, and so on in increments of 5 nm up to at least about 600. In some embodiments, the light source emits light of over 600 nm. The light source can, in certain embodiments, emit light of at most about 600 nm, at most about 595 nm, at most about 590 nm, and so on in increments of 5 nm down to or less than about 200 nm. In some embodiments, the light source emits light at less than 200 nm. In certain embodiments, the light source is a semiconductor light source. When LED chips are used, the LED chips are advantageously filled with a transparent encapsulant with a dome-like shape as shown in FIGS. 20-23. The encapsulant provides the mechanical protection on one hand, and the encapsulant further improves the optical property on the other hand (improved light emission of the LED die).

The phosphor composition may be dispersed in an encapsulant. By the encapsulant, the LED chips disposed on the substrate and a polymer lens are bonded without containing a gas as much as possible. The LED die can be sealed directly by the encapsulant. However, it is also possible that the LED die is sealed with a transparent encapsulant (i.e., in this case, there are the transparent encapsulant and the encapsulant to contain the phosphor composition). Owing to the refraction indices close to each other, there is little loss of reflection at the interface.

In structural modifications, one or more LED chips are disposed on a substrate in a reflection mirror and the phosphor composition is dispersed in a lens disposed on the reflection mirror. Alternatively, one or more LED chips may be disposed on a substrate in a reflection mirror and the phosphor coated on the reflection mirror.

Figure 22:
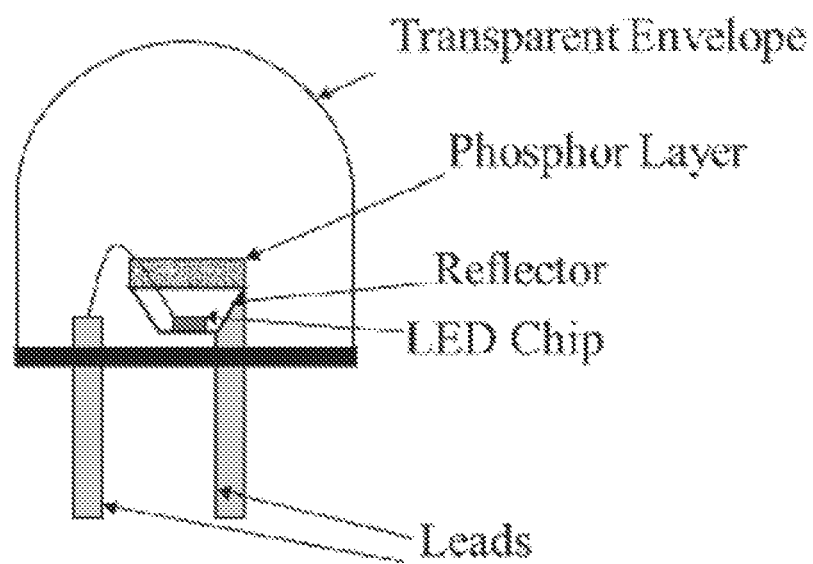
FIG. 22 depicts an embodiment of the light emitting device of the present invention.
Figure 23:
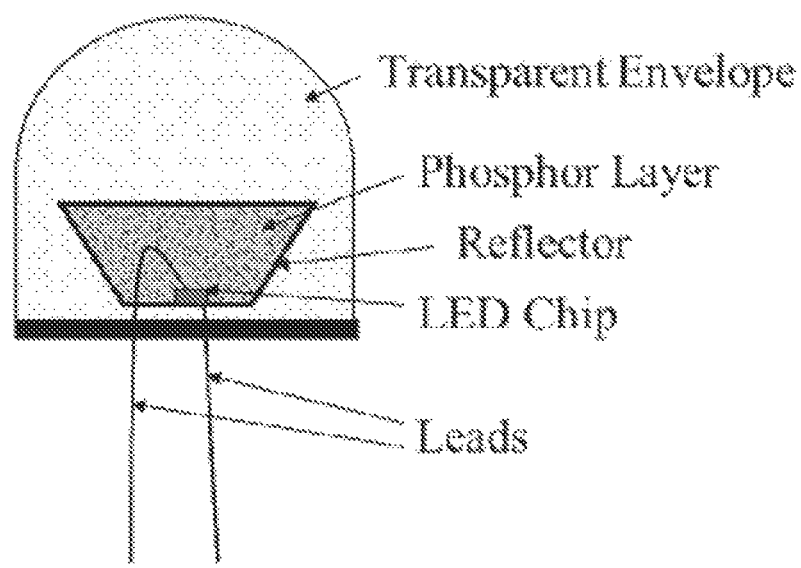
FIG. 23 depicts an embodiment of the light emitting device of the present invention.

In certain embodiments, the phosphor compositions of the present invention may be dispersed in an encapsulant such as silicone and epoxy resin. The phosphor-mixed encapsulant composition may be disposed on to the LED chip which is mounted on a substrate. The structure of the LED combined with the phosphor-mixed encapsulant composition can be sealed by a transparent encapsulant as protective layer. In certain embodiments, the outer transparent encapsulant layer is shaped in a dome shape for directing and distributing the output light (FIGS. 20-23). In an alternative device structure, one or more LED chips are amounted on a substrate and the phosphor-mixed encapsulant composition is disposed onto the multiple-chip device (FIG. 23).

In certain embodiments, the phosphor compositions of the present invention can be dispersed in the light emitting device with a binder, a solidifier, a dispersant, a filler or the like. The binder can be, for example, and without limitation, a light curable polymer, such as an acrylic resin, an epoxy resin, a polycarbonate resin, a silicone resin, a glass, a quartz and the like. The phosphor of the present invention can be dispersed in the binder by methods known in the art. For example, in some cases, the phosphor can be suspended in a solvent with the polymer suspended, thus forming a phosphor-containing slurry composition, which then can be applied on the light emitting device and the solvent evaporated therefrom. In certain embodiments, the phosphor can be suspended in a liquid, such as, a pre-cured precursor to the resin to form a slurry, the slurry then can be dispersed on the light emitting device and the polymer (resin) cured thereon. Curing can be, for example, by heat, UV, or a curing agent (such as, a free radical initiator) mixed with the precursor. As used herein "cure" or "curing" refers to, relates to or is a process for polymerizing or solidifying a substance or mixture thereof, often to improve stability or usability of the substance or mixture thereof. In certain embodiments, the binder used to disperse the phosphor particles in a light emitting device can be liquefied with heat, thereby forming a slurry, and then the slurry is dispersed on the light emitting device and allowed to solidify in situ. Dispersants (meaning a substance that promotes the formation and stabilization of a mixture (e.g., a suspension) of one substance into another) include, for example, and without limitation, titanium oxides, aluminum oxides, barium titanates, silicon oxides, and the like.

In certain embodiments, at least one of the additional phosphors is selected from the following: (1) one or more phosphor compositions that emit red light, including, for example and not limited to, $Ca_{1-x}Sr_x:Eu^{2+}$ ($0 \leq x \leq 1$), $3.5MgO \cdot 0.5MgF_2 \cdot GeO_2:Mn^{4+}$, $Y_2O_2S:Eu^{3+}$, $M_2Si_5N_8:Eu^{2+}$ (M=Ca, Sr, Ba), $MAlSiN_3:Eu^{2+}$ (M=Ca, Sr), $Y_2Si_4N_6C:Eu^{2+}$, and $CaSiN_2:Eu^{2+}$, (2) one or more phosphor compositions that emit green light, including, for example and not limited to, $Ca_{1-x}Sr_xGa_2S_4:Eu^{2+}$ ($0 \leq x \leq 1$), $Ca_{1-x-y-z}Mg_xSr_yBa_zSiO_4:Eu^{2+}$ ($0 \leq x \leq 1, 0 \leq y \leq 1, 0 \leq z \leq 1, x+y+z \leq 1$), $BaMgAl_{10}O_{17}:Eu^{2+}$, $Mn^{2+}$, $MYSi_4N_7:Eu^{2+}$ (M=Ca, Sr, Ba), β-sialon:$Eu^{2+}$, $MSi_2O_2N_2:Eu^{2+}$ (M=Ca, Sr, Ba), $Ba_3Si_6O_{12}N_2:Eu^{2+}$, $M_2Si_5N_8:Ce^{3+}$ (M=Ca, Sr, Ba), $Y_7Si_4N_6C:Ce^{3+}$, and α-sialon:$Yb^{2+}$, (3) one or more phosphor compositions that emit blue light, including, for example and not limited to, $(MSiO_3)_m \cdot (SiO_2)_n:Eu^{2+}$, X (M=Mg, Ca, Sr, Ba; X=F, Cl, Br, I), where m is 1 or 0, and either (i) n>3 if m=1 or (ii) if $MAl_2O_4:Eu^{2+}$ (M=Mg, Ca, Sr), and $BaMgAl_{10}O_{17}:Eu^{2+}$, and (4) one or more phosphor compositions that emit yellow light, including, for example and not limited to, $Y_3Al_5O_{12}:Ce^{3+}$ (cerium-doped garnet type phosphor), and α-sialon:$Eu^{2+}$.

In preferred embodiments, one or more additional phosphor compositions are added to the phosphor compositions of the present invention to make, for example and without limitation, white light LED lamps. The compositions of such additional phosphors can be, without limitation, as follows:

$$C_{1-x}Al_{x-xy}Si_{1-x+xy}N_{2-x-xy}C_{xy}:A; \qquad (a)$$

$$Ca_{1-x-z}Na_zM(III)_{x-xy-z}Si_{1-x+xy+z}N_{2-x-xy}C_{xy}:A; \qquad (b)$$

$$M(II)_{1-x-z}M(I)_zM(III)_{x-xy-z}Si_{1-x+xy+z}N_{2-x-xy}C_{xy}:A; \qquad (c)$$

$$M(II)_{1-x-z}M(I)_zM(III)_{x-xy-z}Si_{1-x+xy+z}N_{2-x-xy-2w/3}C_{xy}O_{w-v/2}H_v:A; \text{ and} \qquad (d)$$

$$M(II)_{1-x-z}M(I)_zM(III)_{x-xy-z}Si_{1-x+xy+z}N_{2-x-xy-2w/3-v/3}C_{xy}O_wH_v:A; \qquad (e)$$

wherein:

$0<x<1$, $0<y<1$, $0<z<1$, $0 \leq v<1$, $0<w<1$, $x+z<1$, $x>xy+z$, $v/2 \leq w$, $x-xy-2w/3-v/3<2$, and $0<x-xy-z<1$;

M(II) is at least one divalent cation;

M(I) is at least one monovalent cation;

M(III) is at least one trivalent cation;

H is at least one monovalent anion; and

A is a luminescence activator.

In the case that multiple phosphor compositions are used, it may be advantageous that the multiple phosphor compositions are suspended in each matrix, and, in that case, these matrices can be disposed back and forth in the light propagation direction. Thereby, the matrix concentration can be reduced compared with the case that the different phosphor compositions are dispersed and mixed together.

The present invention is not to be limited in scope by the specific embodiments in the following examples, which are intended only as exemplary illustrations of the invention. Indeed, various modifications of the invention in addition to those shown and described herein will become apparent to those skilled in the art and are intended to fall within the scope of the appended claims.

EXAMPLES

Preparation and Processes

For all examples described herein, the solid powders selected from $SrCO_3$, $CaCO_3$, $BaCO_3$, $4MgCO_3 \cdot Mg(OH)_2 \cdot 4H_2O$ or MgO, $SrF_2$, $CaF_2$, $Li_2CO_3$, AlN, $Al_2O_3$, $Si_3N_4$, $SiO_2$, SiC, and $Eu_2O_3$ were mixed in the designed ratios specified in the following examples. The mixture was then pulverized by ball milling or grinding for prolonged duration, e.g., 6 hours, by dry or wet milling. The pulverized mixture was dried and sieved, and then loaded in a firing crucible. Subsequently, the mixture was fired at 1300-1600° C. for 6-12 hours in inert or reducing atmosphere, e.g., forming gas ($N_2/H_2$) or $N_2$ in a high temperature furnace. After the firing, the product powder was cooled down to room temperature and ground and sieved.

Example 1

The Preparation of Phosphors Compositions of Family (1)

In this example, exemplary phosphor compositions of family (1), $M(II)_aSi_bO_cN_dC_e:A$, are demonstrated, wherein $M(II)$ is Sr; A is $Eu^{2+}$; and $6.5<a<7.5$, $8.5<b<12.5$, $14<c<16$, $6<d<7.5$, and $0<e<1$. The exemplary preparations were conducted by firing the mixture of the starting materials in the designed ratios listed in Table 1. The phosphor compositions obtained by this process have the target compositions of oxycarbonitride expressed by sample numbers 1.1 and 1.2 based on the starting amounts set forth in Table 1. The phosphor compositions obtained are crystalline powders with a greenish-yellow body color. The luminescence properties of the resultant phosphor compositions are also listed in Tables 1A and 1B. Note that samples 1.1a and 1.1b are created with the same starting materials, but that sample 1.1b was subjected to long-time annealing as further described below.

Figure 1B:
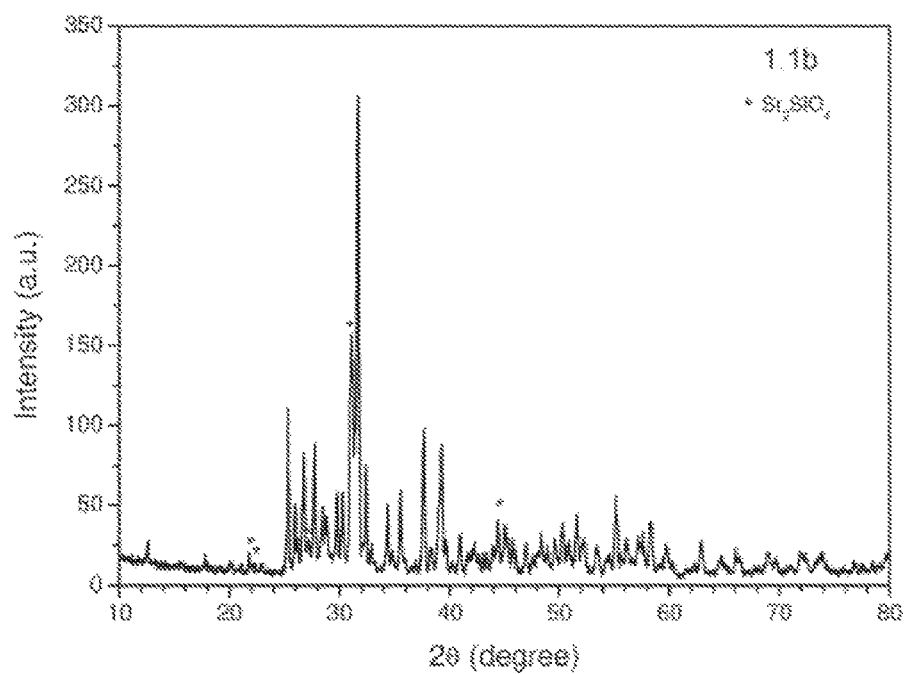

The phosphor materials were characterized by X-ray powder diffraction (XRD). The XRD pattern shows that this phosphor may be in one crystalline phase or another depending on the heating conditions. The representative XRD patterns for samples 1.1a and 1.1b are shown in FIG. 1A and FIG. 1B, respectively. The XRD pattern shown in FIG. 1A indicates that the sample 1.1a contains mainly one crystalline phase which can be indexed to either an orthorhombic (STRUCTURE I) or a triclinic crystal system (STRUCTURE II). The observed X ray powder diffraction data for sample 1.1a is listed in Table 2A. The unit cell parameters for the STRUCTURE I and STRUCTURE II are summarized in Tables 2B and 2C. With long-time heating and annealing for an additional time of about 9-12 hours at about 1100° C.-1300° C., this crystalline sample transformed into another triclinic phase (STRUCTURE III) along with a small amount of strontium silicate phase, as shown in FIG. 1B. The observed XRD data and unit cell parameters for the STRUCTURE III are summarized in Tables 3A and 3B.

TABLE 2A

The observed X-ray diffraction data of sample 1.1a.

| 2θ | d (Å) | $I/I_0$ (%) |
|---|---|---|
| 12.972 | 6.8194 | 1.9 |
| 13.750 | 6.4348 | 1.2 |
| 17.316 | 5.1171 | 0.9 |
| 18.990 | 4.6696 | 3.9 |
| 21.072 | 4.2127 | 9.9 |
| 24.208 | 3.6735 | 1.9 |
| 25.290 | 3.5187 | 15.3 |
| 26.210 | 3.3973 | 47.3 |
| 27.669 | 3.2213 | 35.4 |
| 28.430 | 3.1368 | 100.0 |
| 29.471 | 3.0284 | 2.2 |
| 30.990 | 2.8834 | 1.8 |
| 32.130 | 2.7836 | 21.4 |
| 34.709 | 2.5824 | 8.3 |
| 35.872 | 2.5014 | 13.4 |
| 39.450 | 2.2823 | 7.9 |
| 40.150 | 2.2441 | 11.1 |
| 41.390 | 2.1797 | 2.0 |
| 42.031 | 2.1479 | 9.7 |
| 42.970 | 2.1032 | 1.6 |
| 45.010 | 2.0125 | 38.1 |

TABLE 1A

The amount of starting materials (in grams) and luminescence properties of the resultant phosphor compositions of Example 1.

| | $Sr_aSi_bO_cN_dC_e: Eu^{2+}$ | | | | | Luminescence Characteristics | | |
|---|---|---|---|---|---|---|---|---|
| Sample ID | $SrCO_3$ | SiC | $SiO_2$ | $Si_3N_4$ | $Eu_2O_3$ | QE, % | $\lambda_{em}$, nm | FWHM, nm |
| 1.1a | 2.2762 | 0.0676 | 0.4556 | 0.5910 | 0.0544 | 45.6 | 537 | 103 |
| 1.2 | 2.2762 | 0.0450 | 0.4387 | 0.7091 | 0.0544 | 53.7 | 537 | 103 |

TABLE 1B

The amount of starting materials (in grams) and luminescence properties of the resultant phosphor compositions of Example 1 with long-time annealing.

| | $Sr_aSi_bO_cN_dC_e: Eu^{2+}$ | | | | | Luminescence Characteristics | | |
|---|---|---|---|---|---|---|---|---|
| Sample ID | $SrCO_3$ | SiC | $SiO_2$ | $Si_3N_4$ | $Eu_2O_3$ | QE, % | $\lambda_{em}$, nm | FWHM, nm |
| 1.1b | 2.2762 | 0.0676 | 0.4556 | 0.5910 | 0.0544 | 94 | 540 | 77 |

TABLE 2A-continued

The observed X-ray diffraction data of sample 1.1a.

| 2θ | d (Å) | I/I$_0$ (%) |
|---|---|---|
| 45.669 | 1.9849 | 15.7 |
| 46.973 | 1.9328 | 2.7 |
| 48.150 | 1.8883 | 3.7 |
| 49.029 | 1.8565 | 2.7 |
| 49.590 | 1.8368 | 2.7 |
| 50.308 | 1.8122 | 3.4 |
| 51.230 | 1.7818 | 3.4 |
| 51.631 | 1.7689 | 3.5 |
| 52.310 | 1.7475 | 7.3 |
| 53.390 | 1.7147 | 7.9 |
| 54.210 | 1.6907 | 4.8 |
| 54.551 | 1.6809 | 7.2 |
| 56.910 | 1.6167 | 4.9 |
| 57.030 | 1.6136 | 5.2 |
| 57.350 | 1.6053 | 8.1 |
| 58.250 | 1.5826 | 4.9 |
| 59.111 | 1.5616 | 1.0 |
| 59.711 | 1.5473 | 2.9 |
| 62.191 | 1.4915 | 5.1 |
| 62.330 | 1.4885 | 4.9 |
| 62.852 | 1.4774 | 1.4 |
| 63.791 | 1.4579 | 1.4 |
| 65.130 | 1.4311 | 1.8 |
| 65.249 | 1.4288 | 1.7 |
| 67.689 | 1.3831 | 2.1 |
| 70.991 | 1.3266 | 2.8 |
| 71.149 | 1.3241 | 2.8 |
| 71.949 | 1.3113 | 3.6 |
| 73.551 | 1.2867 | 1.8 |
| 73.749 | 1.2837 | 2.7 |
| 75.708 | 1.2553 | 1.5 |
| 76.171 | 1.2488 | 2.1 |

TABLE 2B

Crystal unit cell parameters of sample 1.1a indexed
to an orthorhombic crystal system (STRUCTURE I).
Crystal system: Orthorhombic
Lattice Parameters:

a = 11.271 Å, b = 8.443 Å, c = 7.867 Å
Unit cell volume = 748.63 Å$^3$

TABLE 2C

Crystal unit cell parameters of sample 1.1a indexed
to a triclinic crystal system (STRUCTURE II).
Crystal system: Triclinic (P1)
Lattice Parameters a = 11.249 Å, b = 8.431 Å, c = 7.862 Å
α = 90.00° β = 89.89° γ = 89.81°
Unit cell volume = 765 Å$^3$

TABLE 3A

The observed X-ray powder diffraction data of sample 1.1b
indexed to a triclinic crystal system (STRUCTURE III).

| 2θ | d (Å) | I/I$_0$ (%) | (h k l) |
|---|---|---|---|
| 12.570 | 7.0364 | 4.3 | (0 1 0) |
| 15.611 | 5.6720 | 1.1 | (1 1 0) |
| 17.749 | 4.9931 | 2.8 | (0 1 1) |
| 20.130 | 4.4076 | 1.8 | (−1 1 0) |
| 23.027 | 3.8592 | 1.5 | (1 −1 1) |
| 25.309 | 3.5162 | 32.6 | (0 2 0) |
| 25.952 | 3.4305 | 12.2 | (1 2 0) |
| 26.750 | 3.3300 | 21.6 | (1 0 2) |
| 27.710 | 3.2168 | 23.4 | (0 −1 2) |
| 28.471 | 3.1324 | 11.0 | (1 2 1) |
| 28.810 | 3.0964 | 9.2 | (1 1 2) |
| 29.750 | 3.0007 | 14.1 | (−2 0 1) |
| 30.249 | 2.9522 | 13.6 | (−1 −1 2) |
| 31.090 | 2.8743 | 46.2 | (1 −1 2) |
| 31.410 | 2.8457 | 25.7 | (−1 2 0) |
| 31.650 | 2.8247 | 100.0 | (−2 1 0) |
| 32.889 | 2.7211 | 2.3 | (−1 1 2) |
| 34.350 | 2.6086 | 13.3 | (−1 2 1) |
| 34.790 | 2.5766 | 3.0 | (2 1 2) |
| 35.531 | 2.5246 | 16.6 | (1 2 2) |
| 36.531 | 2.4577 | 0.9 | (−1 −2 2) |
| 37.630 | 2.3884 | 29.7 | (−2 0 2) |
| 38.230 | 2.3523 | 3.8 | (1 3 0) |
| 39.011 | 2.3070 | 13.6 | (2 −1 2) |
| 40.169 | 2.2431 | 1.0 | (−1 −3 1) |
| 40.930 | 2.2031 | 7.6 | (0 3 1) |
| 41.651 | 2.1667 | 2.8 | (−3 −1 1) |
| 41.968 | 2.1510 | 3.6 | (3 2 0) |
| 44.008 | 2.0559 | 2.7 | (−1 3 0) |
| 44.370 | 2.0400 | 8.3 | (2 1 3) |
| 45.009 | 2.0125 | 6.6 | (−3 −2 1) |
| 46.089 | 1.9678 | 3.2 | (0 2 3) |
| 47.030 | 1.9306 | 5.7 | (3 2 2) |
| 48.050 | 1.8920 | 2.3 | (2 3 2) |
| 48.410 | 1.8788 | 6.7 | (2 2 3) |
| 48.990 | 1.8579 | 2.8 | (−3 0 2) |
| 49.610 | 1.8361 | 5.2 | (3 −1 2) |
| 50.310 | 1.8122 | 8.7 | (3 3 1) |
| 50.912 | 1.7921 | 3.8 | (1 4 0) |
| 51.650 | 1.7683 | 10.2 | (−3 −3 1) |
| 52.271 | 1.7487 | 5.7 | (4 1 0) |
| 53.410 | 1.7141 | 5.2 | (2 4 0) |
| 54.253 | 1.6894 | 2.1 | (3 3 2) |
| 55.151 | 1.6640 | 13.0 | (3 2 3) |
| 57.171 | 1.6099 | 5.2 | (1 4 2) |
| 57.610 | 1.5987 | 5.9 | (−1 4 0) |
| 58.291 | 1.5816 | 9.6 | (4 2 2) |
| 59.413 | 1.5544 | 1.9 | (0 4 2) |
| 59.711 | 1.5474 | 5.5 | (3 4 1) |
| 60.291 | 1.5339 | 1.2 | (−2 −4 2) |
| 62.228 | 1.4907 | 1.1 | (3 1 4) |
| 62.910 | 1.4761 | 6.0 | (4 1 3) |
| 64.611 | 1.4413 | 2.5 | (1 4 3) |
| 66.427 | 1.4063 | 2.6 | (2 5 0) |
| 69.031 | 1.3594 | 4.1 | (0 5 1) |
| 69.650 | 1.3489 | 1.9 | (4 3 3) |
| 71.911 | 1.3119 | 3.9 | (5 3 1) |
| 73.910 | 1.2813 | 3.7 | (1 4 4) |

TABLE 3B

Figure 2A:
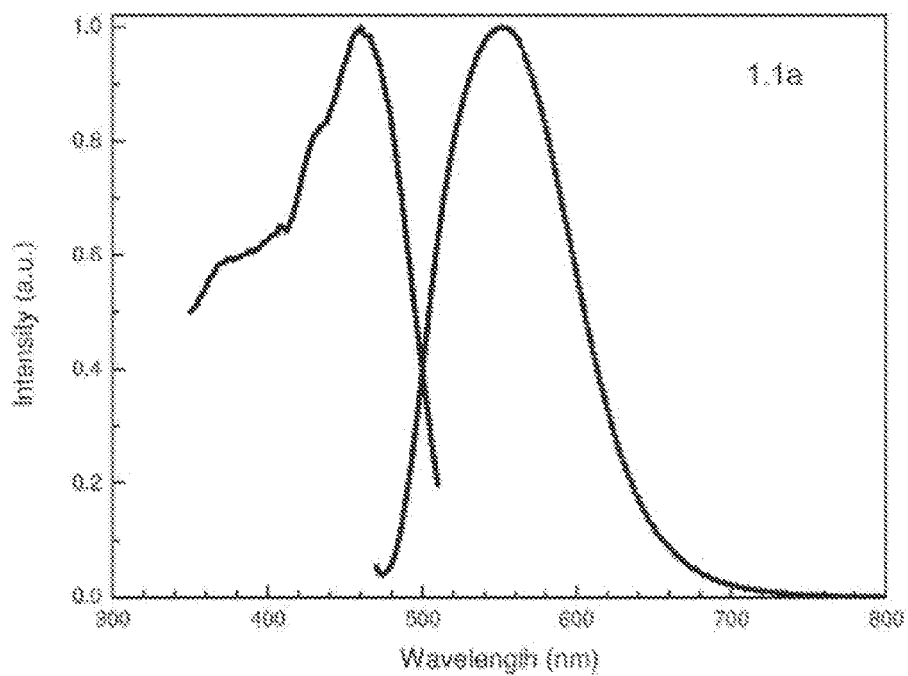
Figure 2B:
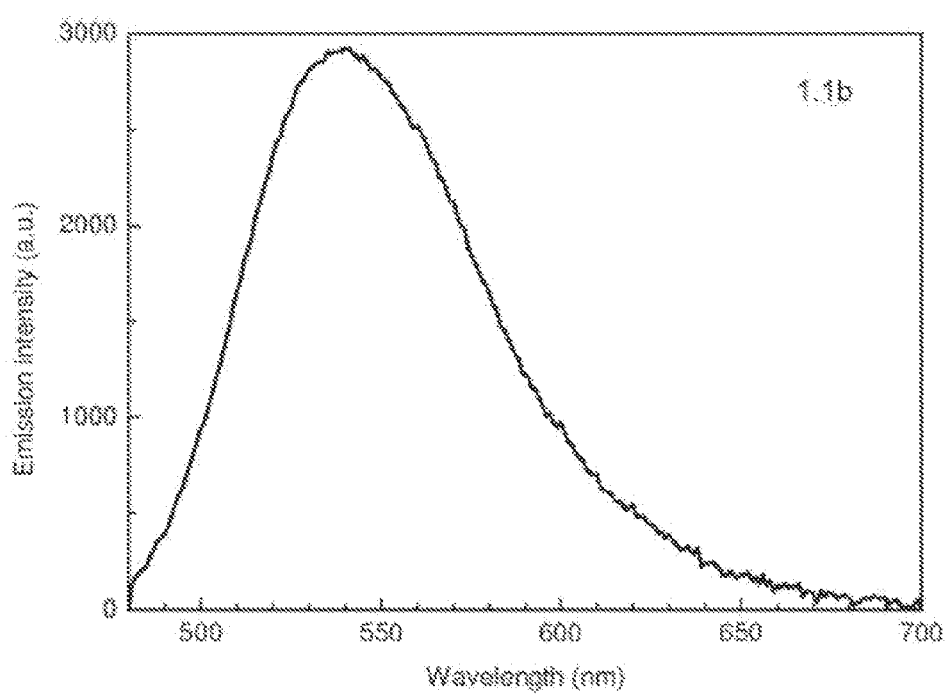
FIG. 2B depicts the emission spectrum of sample 1.1b.
Figure 3:
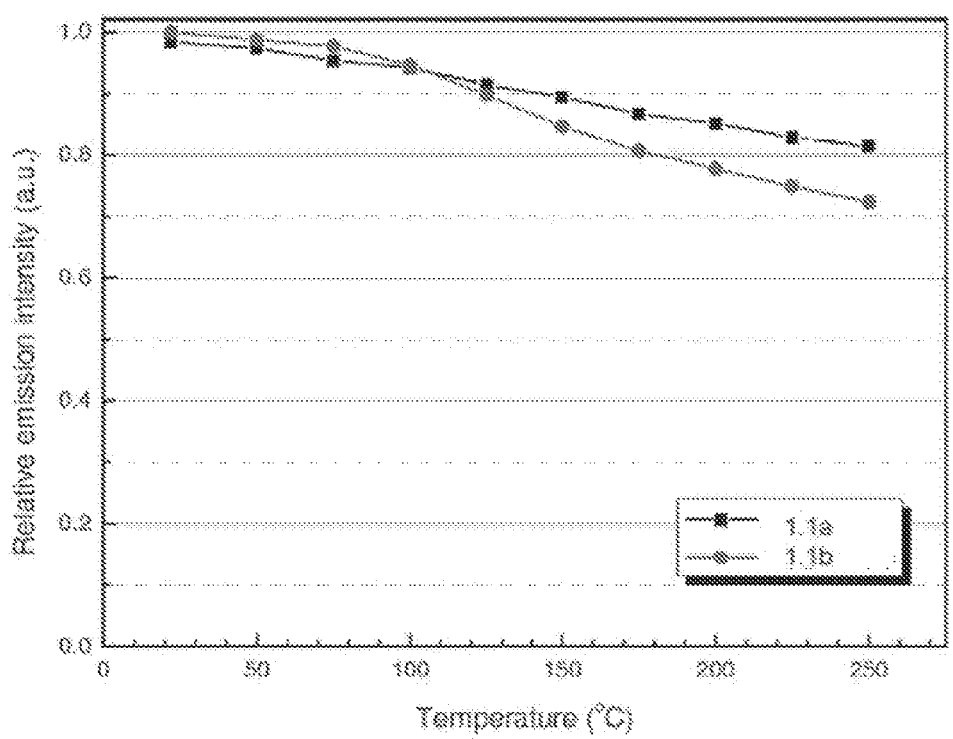
FIG. 3 depicts the thermal quenching profiles of the phosphor compositions of samples 1.1a and 1.1b.

Crystal unit cell parameters of sample 1.1b indexed
to a triclinic crystal system (STRUCTURE III).
Crystal system: Triclinic
Lattice Parameters:

a = 7.03373 Å, b = 7.14537 Å, c = 7.28065 Å
α = 89.50°, β = 85.27°, γ = 76.72°
Unit cell volume = 354.9 Å$^3$ The luminescence excitation and emission spectra of samples 1.1a and 1.1b are shown in FIGS. 2A and 2B, respectively. The luminescence is efficiently excited in a wavelength range of 410 nm to 490 nm, and the luminescence emission emits in the range of 510 nm to 600 nm, peaking at about 540 nm. The thermal quenching characteristic of samples 1.1a and 1.1b are shown in FIG. 3. It shows that the luminescence maintenance of the phosphor composition of sample 1.1a at 150° C. is about 85% of that at room temperature. At low temperatures, sample 1.1b exhibited a slightly better luminescence maintenance compared to sample 1.1a. However at temperatures above about 100° C., sample 1.1a exhibited superior luminescence maintenance compared to sample 1.1b.

Example 2

The Preparation of Phosphor Compositions of Family (2)

Example 2a

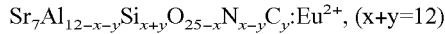
$Sr_7Al_{12-x-y}Si_{x+y}O_{25-x}N_{x-y}C_y:Eu^{2+}$, (x+y=12)

Figure 6:
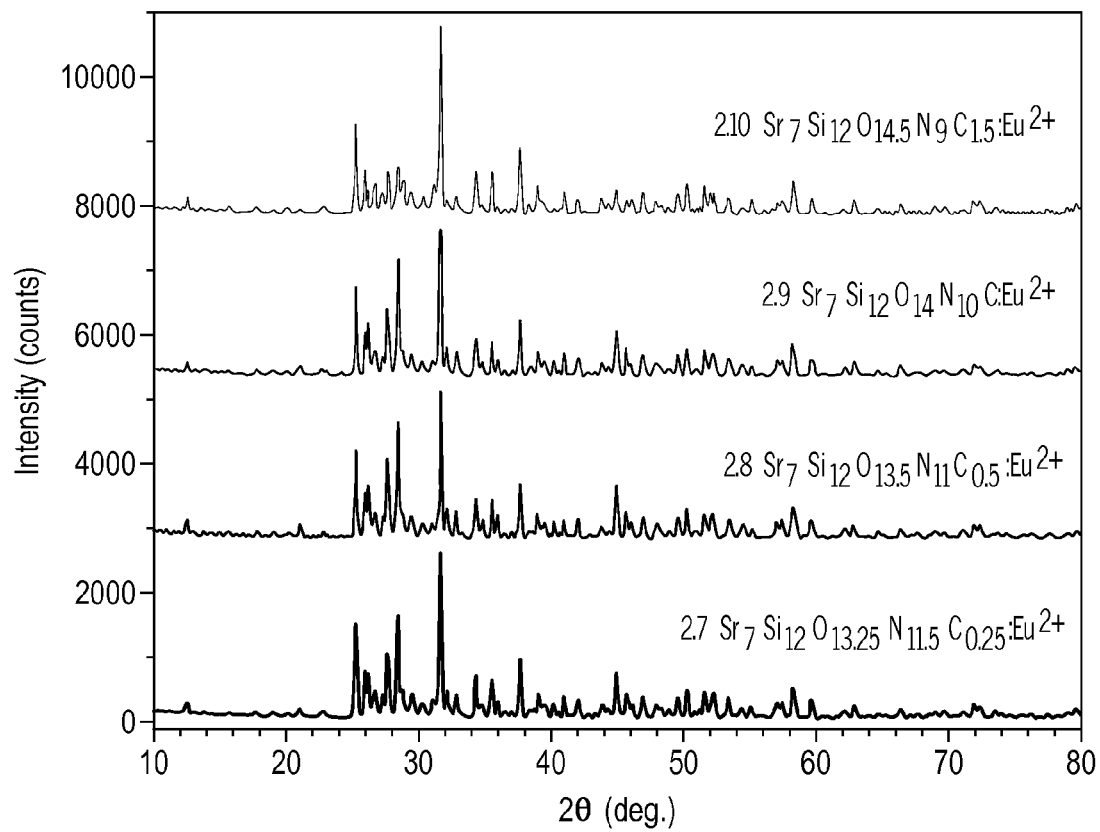

To prepare the exemplary phosphor compositions of family (2), $Sr_7Al_{12-x-y}Si_{x+y}O_{25-x}N_{x-y}C_y:Eu^{2+}$ (x+y=12), or $Sr_7Si_{12}O_{25-x}N_{x-y}C_y:Eu^{2+}$, the starting materials were mixed in designed ratios listed in Table 4. The samples were prepared by following the preparation processes described above. The phosphor compositions obtained by the process have the target compositions of oxycarbonitride expressed by $Sr_7Si_{12}O_{25-x}N_{x-y}C_y:Eu^{2+}$ based on the starting amounts set forth in Table 4 (see also FIG. 6). The phosphor compositions obtained are crystalline powders with a green or yellow-green body color. The luminescence properties of the resultant phosphor compositions are also listed in Table 4.

TABLE 5

Crystal structure parameters of sample 2.10

Crystal system: Triclinic
Space group: P1 (No. 1)
Density: 3.736 g/cm³; Z: 4
Unit cell volume = 359.71 Å³

Lattice Parameters

| a = 7.1011(37) Å | b = 7.2039(8) Å | c = 7.2728(2) Å |
| α = 88.931(4) | β = 84.915(5) | γ = 76.093(2) |

Figure 5:
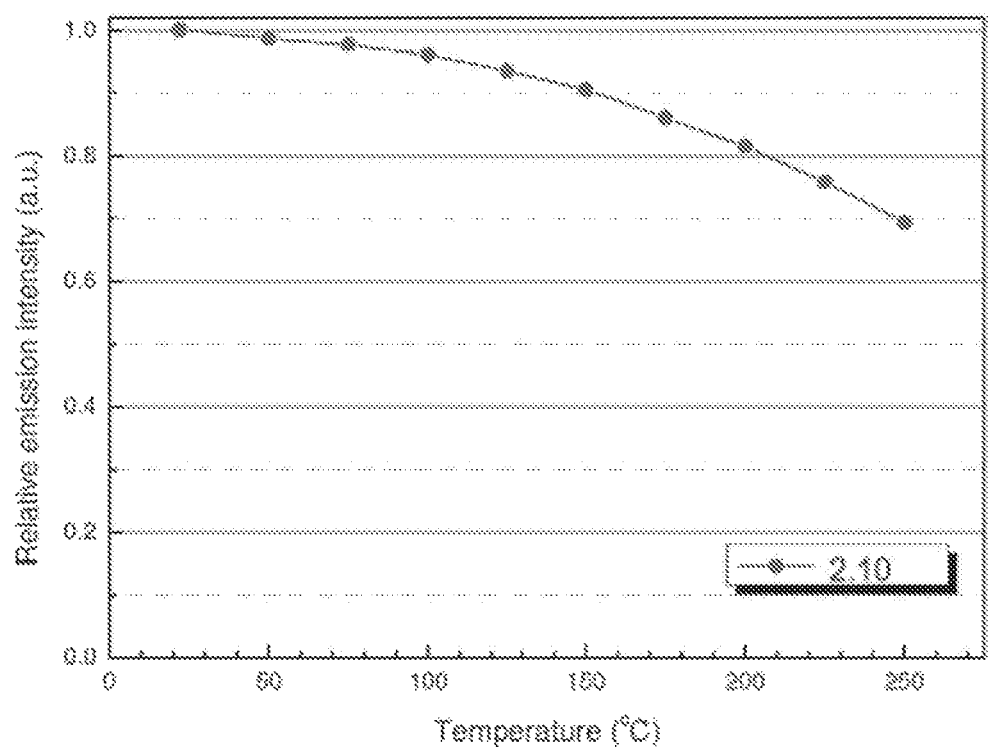
FIG. 5 depicts the thermal quenching characteristic of the phosphor composition of sample 2.10.

The luminescence of sample 2.10 is efficiently excited in a wavelength range of about 410 nm to about 490 nm, and the luminescence emission emits in the range of about 510 nm to about 600 nm, peaking at about 540 nm. Compared with sample 1.1a, it is observed that the excitation profile of sample 2.10 is different from that of sample 1.1a, and that the emission curve of sample 2.10 is also different from that of sample 1.1. These facts indicate that the different crystalline structures lead to different luminescence properties between the sample 2.10 and the sample 1.1a. The thermal quenching profile of 2.10 is shown in FIG. 5. It shows that the luminescence maintenance at 150° C. of each sample is about 90% of that at room temperature.

The exemplary samples of composition (2), 2.5, 2.7, 2.8, 2.9 and 2.13, contain mainly two phases, the STRUCTURE I (or STRUCTURE II) as demonstrated in Example 1 and the STRUCTURE III demonstrated by the sample 2.10. These

TABLE 4

The amount of starting materials (in grams) and luminescence properties of the resultant phosphor compositions in Example 2a ($Sr_7Al_{12-x-y}Si_{x+y}O_{25-x}N_{x-y}C_y:Eu^{2+}$; x + y = 12).

| | $Sr_7Si_{12}O_{25-x}N_{x-y}C_y$: Eu²⁺ | | | | | Luminescence Characteristics | | |
|---|---|---|---|---|---|---|---|---|
| Sample ID | SrCO₃ | SiC | SiO₂ | Si₃N₄ | Eu₂O₃ | QE, % | λ$_{em}$, nm | FWHM, nm |
| 2.1 | 2.2751 | 0.0450 | 0.4387 | 0.8666 | 0.0553 | 55.2 | 541 | 101 |
| 2.2 | 2.2751 | 0.0901 | 0.4724 | 0.7878 | 0.0553 | 58.3 | 541 | 99 |
| 2.3 | 2.3060 | 0.0904 | 0.4740 | 0.7905 | 0.0278 | 69.4 | 532 | 78 |
| 2.4 | 2.2751 | 0.0901 | 0.4724 | 0.7878 | 0.0553 | 75.2 | 534 | 104 |
| 2.5 | 2.2137 | 0.0895 | 0.4693 | 0.7826 | 0.1099 | 80.9 | 538 | 79 |
| 2.6 | 2.2137 | 0 | 0.4022 | 0.9391 | 0.1099 | 85 | 539 | 79 |
| 2.7 | 2.2137 | 0.0224 | 0.4190 | 0.9000 | 0.1099 | 87.3 | 541 | 79 |
| 2.8 | 2.2137 | 0.0447 | 0.4357 | 0.8608 | 0.1099 | 80 | 539 | 79 |
| 2.9 | 2.2137 | 0.0895 | 0.4692 | 0.7826 | 0.1099 | 80.9 | 538 | 79 |
| 2.10 | 2.2137 | 0.1342 | 0.5028 | 0.7043 | 0.1099 | 89.4 | 541 | 77 |
| 2.11 | 2.2137 | 0.1342 | 0.5028 | 0.7043 | 0.1099 | 79.2 | 537 | 107 |
| 2.12 | 2.2137 | 0.1789 | 0.5363 | 0.6261 | 0.1099 | 72.9 | 539 | 104 |
| 2.13 | 2.2137 | 0.2237 | 0.5698 | 0.5478 | 0.1099 | 76.8 | 538 | 80 |
| 2.14 | 2.2137 | 0.0895 | 0.4693 | 0.7826 | 0.1099 | 81 | 541 | 80 |
| 2.15 | 2.2751 | 0.0676 | 0.4555 | 0.5909 | 0.0553 | 63.1 | 536 | 106 |
| 2.16 | 2.2137 | 0.0671 | 0.4525 | 0.5869 | 0.1099 | 68.3 | 541 | 80 |
| 2.17 | 2.2137 | 0.0895 | 0.4693 | 0.4695 | 0.1099 | 55 | 538 | 112 |
| 2.18 | 2.2137 | 0.1342 | 0.5028 | 0.7043 | 0.1099 | 85.6 | 541 | 77 |
| 2.19 | 2.2137 | 0.1789 | 0.5363 | 0.6261 | 0.1099 | 69.7 | 540 | 76 |
| 2.20 | 2.2137 | 0.2237 | 0.5698 | 0.5478 | 0.1099 | 69.7 | 539 | 78 |
| 2.21 | 2.2137 | 0.2684 | 0.6033 | 0.4695 | 0.1099 | 76.2 | 538 | 77 |

Figure 4A:
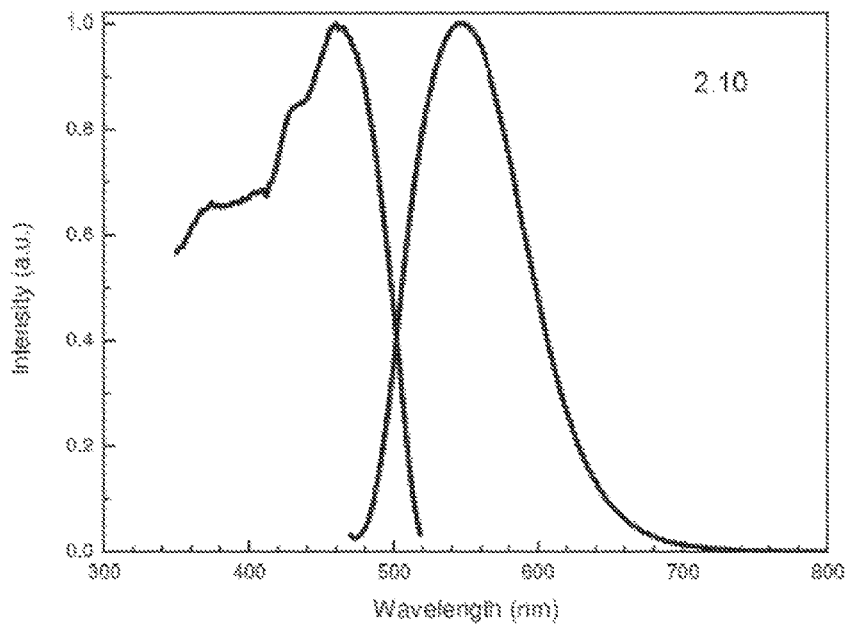
FIG. 4A depicts the excitation (left curve) and emission (right curve) spectra of sample 2.10.
Figure 4B:
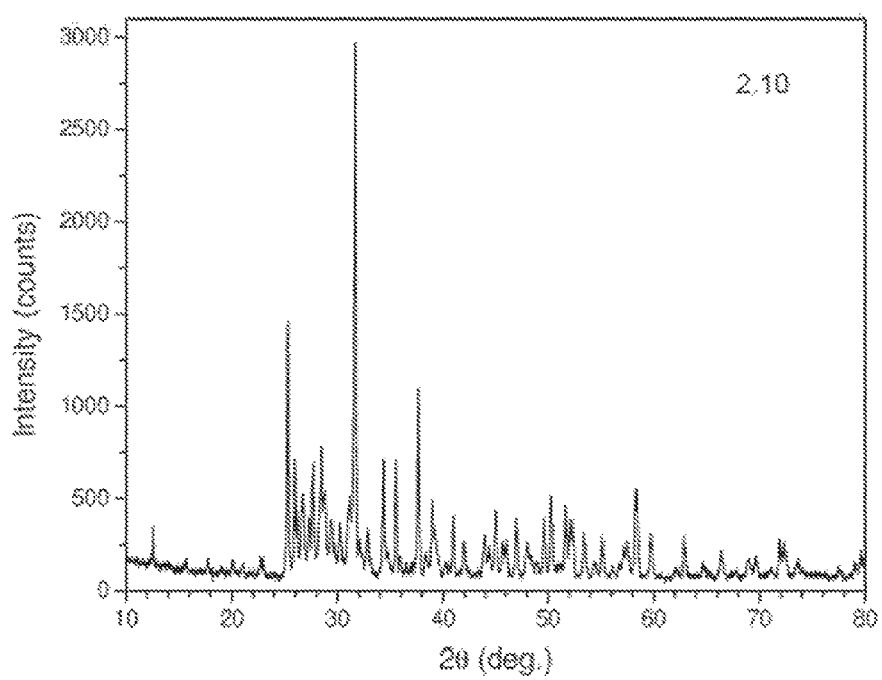
FIG. 4B depicts the XRD pattern of the phosphor composition of sample 2.10, which demonstrates a high proportion of a triclinic crystalline phase.
Figure 7A:
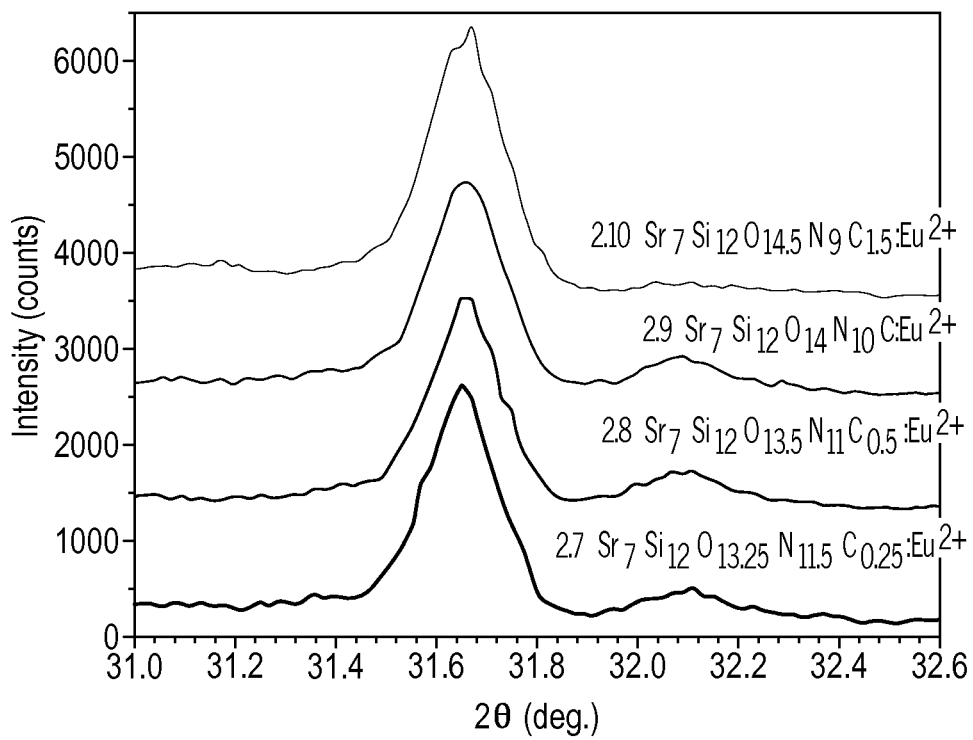
Figure 7B:
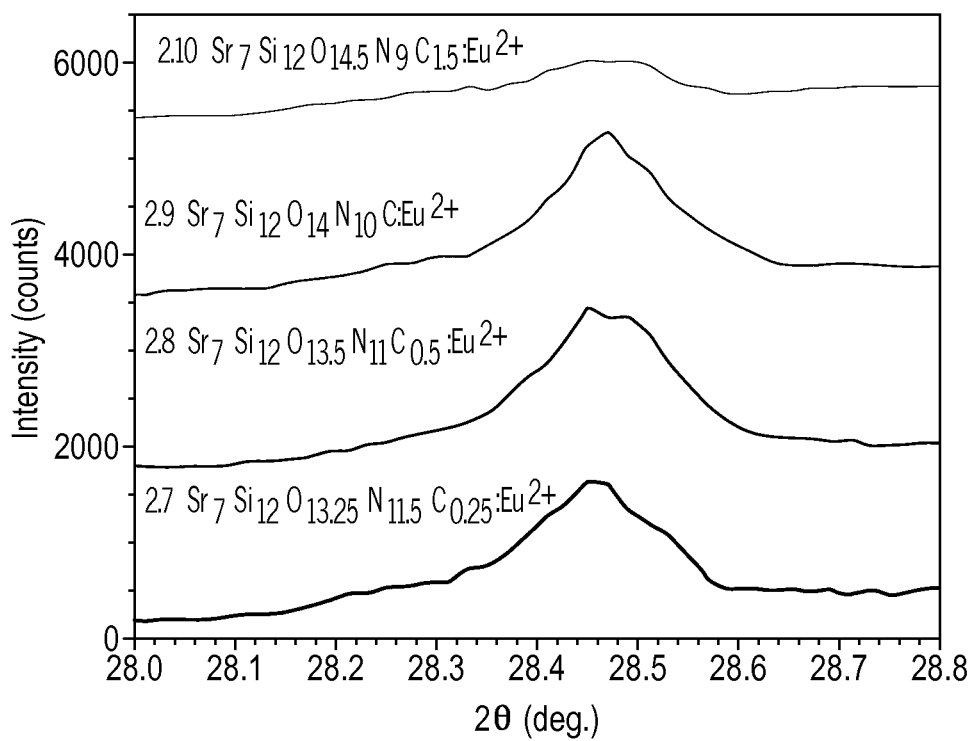

FIG. 4A shows the luminescence excitation and emission spectra of sample 2.10. The XRD pattern for sample 2.10 that is shown in FIG. 4B demonstrates that this phosphor composition contains mainly one crystalline phase. The diffraction patterns of exemplary sample 2.10 can be indexed to a triclinic crystal system belonging to space group P1 (No. 1). The resultant unit cell parameters of sample 2.10 are summarized in Table 5. This structure is similar to STRUCTURE III discussed above, phosphor compositions have mainly two crystalline phases and contain varied content of carbon. It is noticed that the amount of the STRUCTURE I (or STRUCTURE II) relative to that of the STRUCTURE III is varied as the content of carbon changes in the series of 2.7, 2.8, 2.9 and 2.10, as shown by the XRD patterns in FIG. 6. Meanwhile, the peak of diffraction (−2 1 0) is shifted toward higher 2θ angle as the content of carbon increases (FIGS. 7A and 7B), indicating the shrinkage of the lattice of the triclinic (P1) phase.

Figure 8:
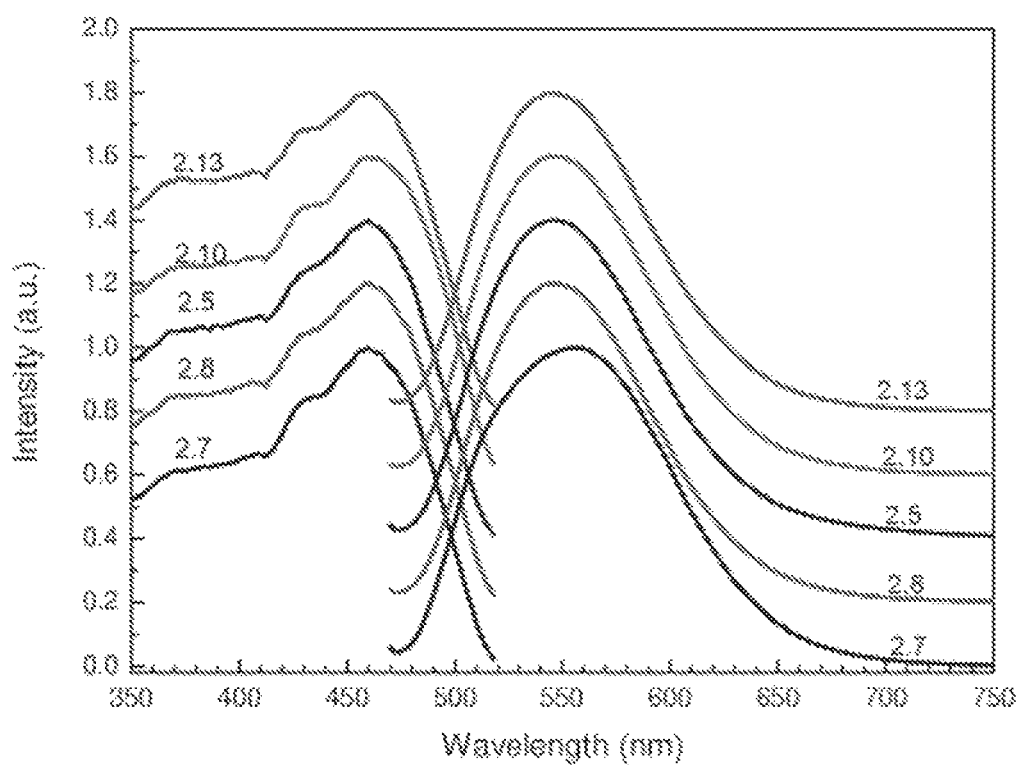
FIG. 8 depicts the excitation profiles (left curves) and emission spectra (right curves) of the phosphor compositions of samples 2.7, 2.8, 2.5, 2.10, and 2.13.
Figure 9:
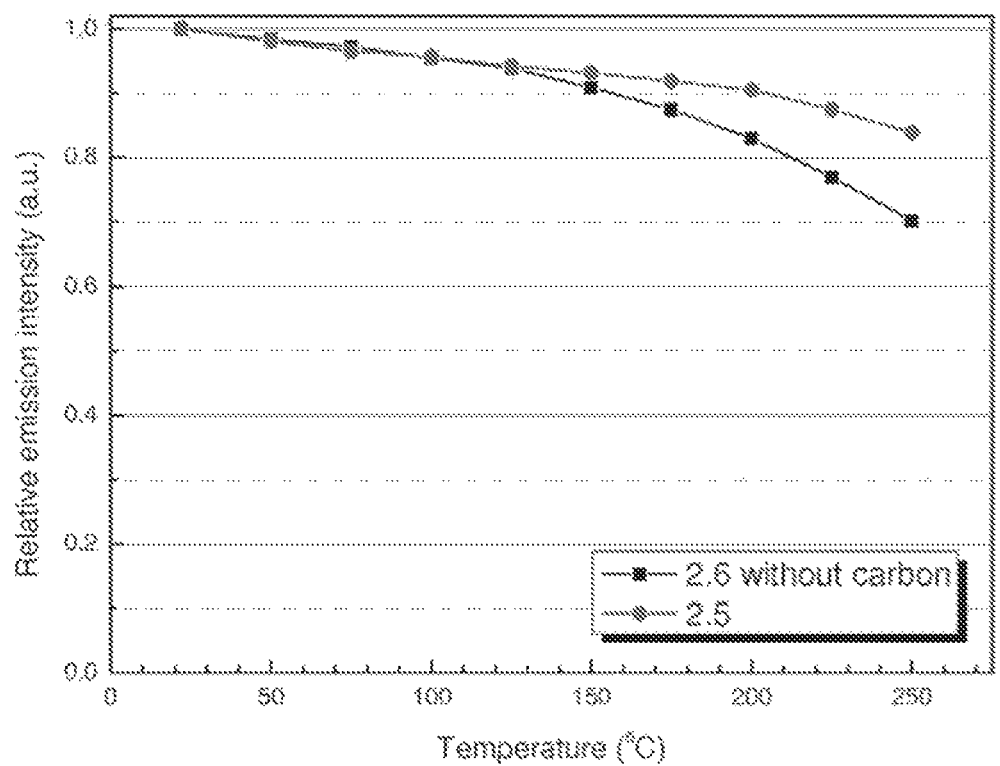
FIG. 9 depicts the thermal quenching profiles of two phosphor compositions of Example 2a, samples 2.6 (carbon-free) and 2.5 (carbon containing).

The luminescence emission spectra of exemplary samples of composition (2) are shown in FIG. 8. The phosphor compositions emit green or yellow-green light under blue or nUV light excitation. The thermal quenching characteristics of two samples, shown in FIG. 9, are nearly the same at temperatures of 25-150° C., and become different at temperatures higher than 150° C. Compared to a phosphor having no carbon in its structure (e.g. 2.6), the phosphor composition having carbon in its structure (2.5) has a higher thermal stability.

Example 2b

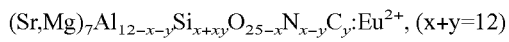

The phosphors of composition $(Sr,Mg)_7Al_{12-x-y}Si_{x+y}O_{25-x}N_{x-y}C_y:Eu^{2+}$, (x+y=12) (or $(Sr,Mg)_7Si_{12}O_{25-x}N_{x-y}C_y:Eu^{2+}$), were prepared by the processes described above. The starting materials were mixed in designed ratios listed in Table 6. Compared with the composition of Example 2a, Mg has been incorporated into the composition.

TABLE 6

The amount of starting materials (in grams) and luminescence properties of the resultant phosphor compositions in Example 2b ($(Sr,Mg)_7Al_{12-x-y}Si_{x+y}O_{25-x}N_{x-y}C_y: Eu^{2+}$; x + y = 12).

| | $Sr_7Si_{12}O_{25-x}N_{x-y}C_y: Eu^{2+}$ | | | | | | Luminescence Characteristics | | |
|---|---|---|---|---|---|---|---|---|---|
| Sample ID | $SrCO_3$ | SiC | $SiO_2$ | $Si_3N_4$ | $Eu_2O_3$ | MgO | QE, % | $\lambda_{em}$, nm | FWHM, nm |
| 3.1 | 2.1964 | 0.0453 | 0.3597 | 0.9349 | 0.1113 | 0.0122 | 87 | 541 | 77 |
| 3.2 | 2.1964 | 0.0906 | 0.3936 | 0.8557 | 0.1113 | 0.0122 | 96.3 | 541 | 76 |
| 3.3 | 2.1964 | 0.1359 | 0.4276 | 0.7764 | 0.1113 | 0.0122 | 85 | 541 | 77 |
| 3.4 | 2.1964 | 0.1812 | 0.4615 | 0.6972 | 0.1113 | 0.0122 | 83.6 | 543 | 76 |
| 3.5 | 2.1931 | 0.0904 | 0.4134 | 0.8386 | 0.1111 | 0.0122 | 89.9 | 541 | 76 |
| 3.6 | 2.1931 | 0.1809 | 0.4811 | 0.6804 | 0.1111 | 0.0122 | 87.6 | 542 | 76 |
| 3.7 | 2.1832 | 0.1351 | 0.5060 | 0.7088 | 0.1106 | 0.0122 | 80 | 542 | 76 |
| 3.8 | 2.1756 | 0.1353 | 0.5068 | 0.7099 | 0.1108 | 0.0152 | 78.7 | 541 | 77 |
| 3.9 | 2.1679 | 0.1355 | 0.5076 | 0.7111 | 0.1110 | 0.0183 | 71.1 | 543 | 77 |
| 3.10 | 2.1601 | 0.1357 | 0.5084 | 0.7122 | 0.1112 | 0.0214 | 73.7 | 538 | 75 |
| 3.11 | 2.1524 | 0.1359 | 0.5092 | 0.7133 | 0.1114 | 0.0245 | 69.3 | 545 | 77 |
| 3.12 | 2.1832 | 0.0900 | 0.4722 | 0.7876 | 0.1106 | 0.0122 | 74 | 541 | 76 |
| 3.13 | 2.1756 | 0.0902 | 0.4730 | 0.7888 | 0.1108 | 0.0152 | 85.7 | 543 | 76 |
| 3.14 | 2.1679 | 0.0903 | 0.4737 | 0.7901 | 0.1110 | 0.0183 | 82.5 | 541 | 76 |
| 3.15 | 2.1601 | 0.0905 | 0.4745 | 0.7913 | 0.1112 | 0.0214 | 80.3 | 541 | 76 |
| 3.16 | 2.1524 | 0.0906 | 0.4753 | 0.7926 | 0.1114 | 0.0245 | 75.3 | 545 | 77 |

Figure 10:
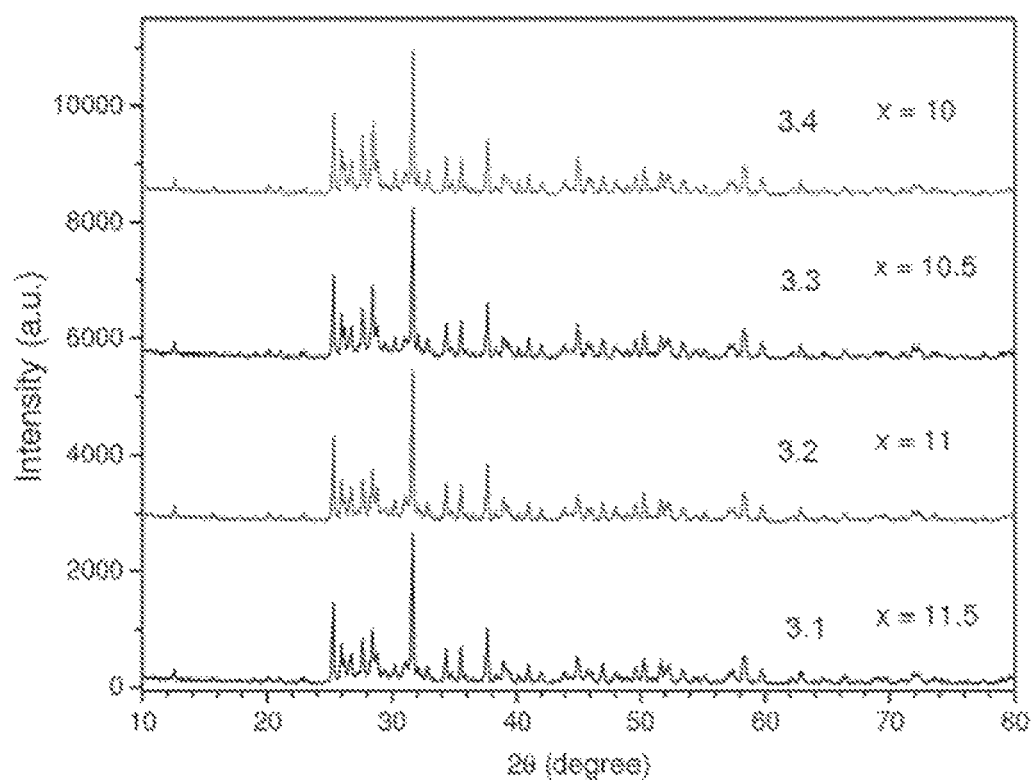
FIG. 10 depicts the XRD patterns of phosphor compositions of Example 2b.
Figure 11:
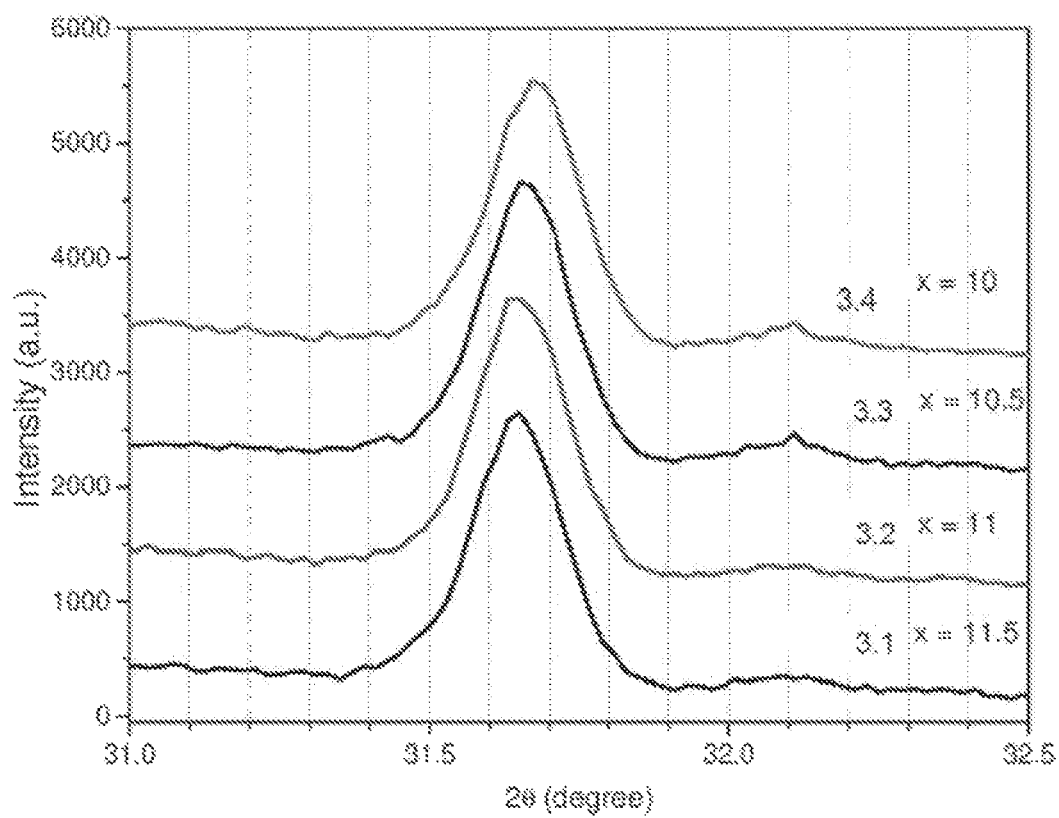
FIG. 11 depicts a further view of the XRD patterns of phosphor compositions of Example 2b.

For the series of samples 3.1, 3.2, 3.3 and 3.4, the XRD patterns (see FIG. 10) show that the each of the phosphor compositions contains mainly two phases, the orthorhombic and the triclinic phase, as observed in Example 1 and Example 2a, respectively. The diffractions from the triclinic phase are shifted toward higher 2θ angles as the content of carbon increases in the composition, as typically shown by the peak (−2 1 0) in FIG. 11. This observation indicates shrinkage of the crystal lattice as the content of carbon increases in the composition, and an accompanying increase in oxygen content in the lattice.

Figure 12:
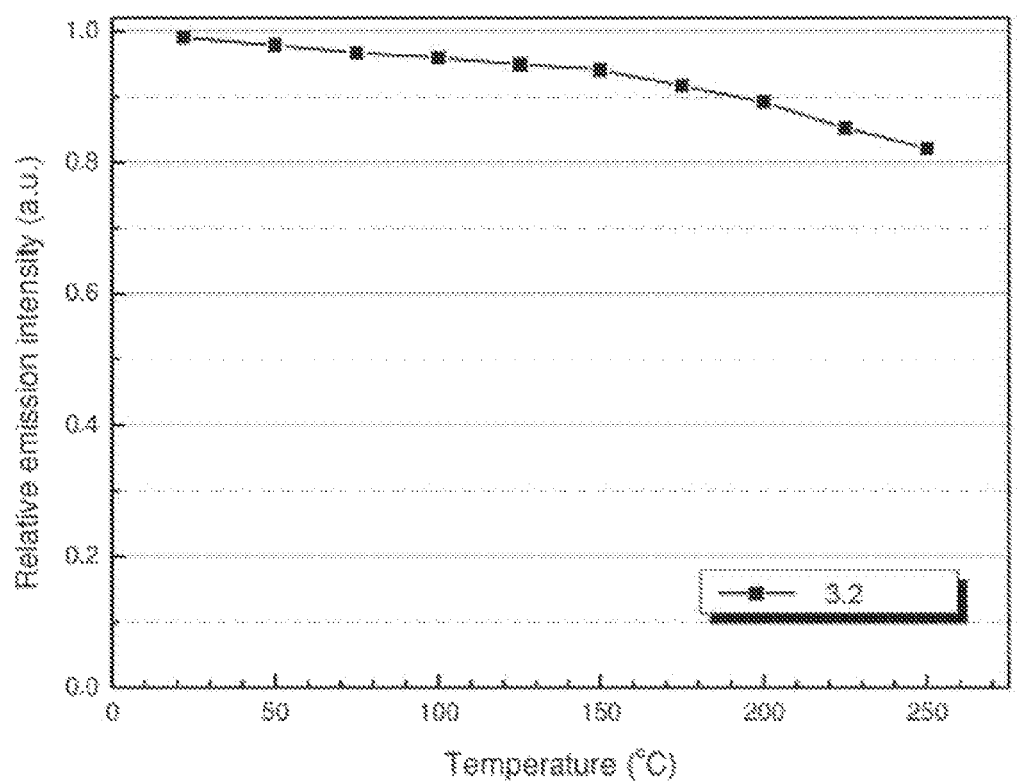
FIG. 12 depicts the thermal quenching profile of the phosphor composition of sample 3.2.

FIG. 12 shows the thermal quenching profile of the luminesce emission of sample 12. The lumen maintenance is about 95% at 150° C., indicating a very high lumen maintenance of this phosphor composition.

Example 2c

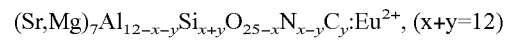

The phosphors of composition $(Sr,Mg)_7Al_{12-x-y}Si_{x+y}O_{25-x}N_{x-y}C_y:Eu^{2+}$, (x+y=12), or $(Sr,Mg)_7Si_{12}O_{25-x}N_{x-y}C_y: Eu^{2+}$, were prepared by the processes described above. The raw materials were mixed in designed ratios listed in Table 7. Compared to the compositions of Examples 2a and 2b, the content of carbon is systematically altered in this Example 2c, while maintaining the content of oxygen from $SiO_2$ as constant in the composition.

TABLE 7

The amount of starting materials (in grams) and luminescence properties of the phosphors of Example 2c ($(Sr,Mg)_7Al_{12-x-y}Si_{x+y}O_{25-x}N_{x-y}C_y: Eu^{2+}$; x + y = 12).

| | $(Sr,Mg)_7Si_{12}O_{25-x}N_{x-y}C_y: Eu^{2+}$ | | | | | | Luminescence Characteristics | | |
|---|---|---|---|---|---|---|---|---|---|
| Sample ID | $SrCO_3$ | SiC | $SiO_2$ | $Si_3N_4$ | $Eu_2O_3$ | MgO | QE, % | $\lambda_{em}$, nm | FWHM, nm |
| 4.1 | 2.1832 | 0.0000 | 0.4048 | 0.9451 | 0.1106 | 0.0122 | 85.5 | 541 | 77 |
| 4.2 | 2.1886 | 0.0451 | 0.4061 | 0.8945 | 0.1109 | 0.0122 | 85.5 | 539 | 77 |
| 4.3 | 2.1941 | 0.0905 | 0.4075 | 0.8437 | 0.1112 | 0.0122 | 76.1 | 538 | 77 |
| 4.4 | 2.1997 | 0.1361 | 0.4078 | 0.7935 | 0.1115 | 0.0123 | 70.9 | 541 | 76 |
| 4.5 | 2.2052 | 0.1819 | 0.4092 | 0.7422 | 0.1118 | 0.0123 | 68.2 | 541 | 76 |

Figure 13:
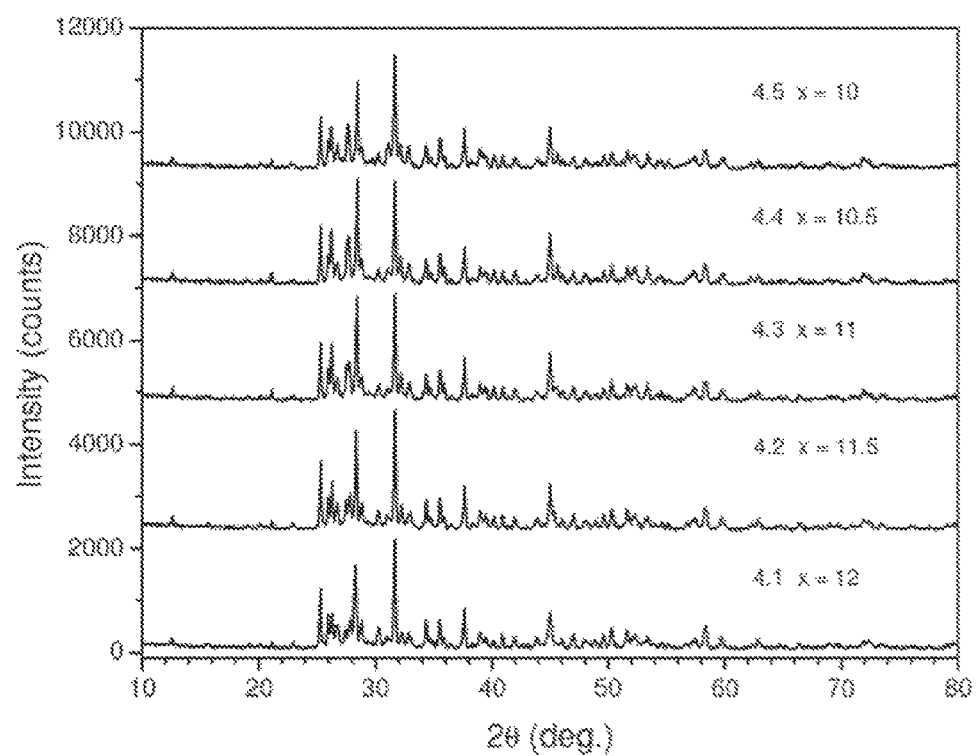
FIG. 13 depicts the XRD patterns of phosphor compositions of Example 2c.
Figure 14A:
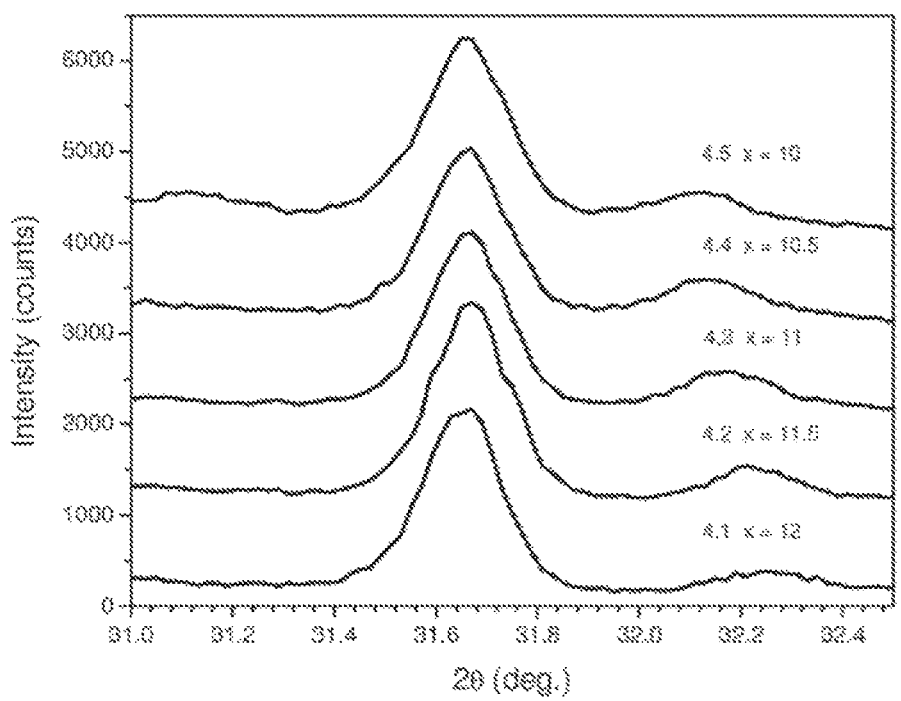
FIGS. 14A and 14B each depict a further view of the XRD patterns of phosphor compositions of Example 2c.
Figure 14B:
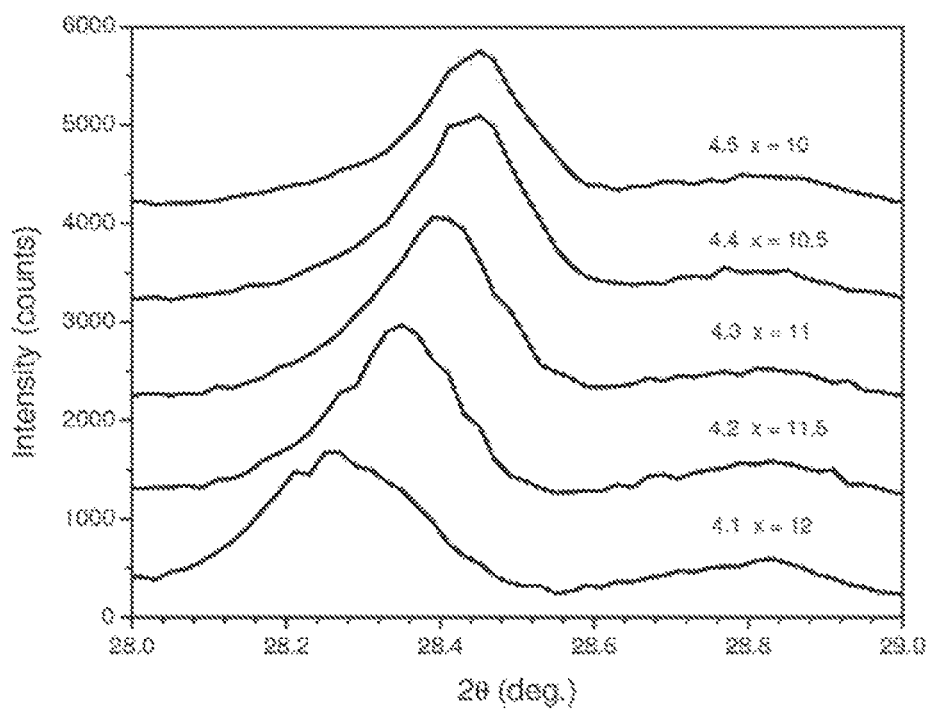

The XRD patterns for these exemplary compositions are shown in FIG. 13. Similar to those of Example 2b, the XRD data show that each of the phosphors contains mainly two phases, the STRUCTURE I (orthorhombic) or STRUCTURE II (triclinic), and the STRUCTURE III (triclinic). It is found that the amount of STRUCTURE III relative to that of the STRUCTURE I (or STRUCTURE II) is varied as the content of carbon changes in the series of 4.1, 4.2, 4.3, 4.4 and 4.5, indicating an effect of carbon content on the crystal structures. When the content of oxygen is fixed, the diffractions of the STRUCTURE III (−2 1 0) are shifted toward higher 2θ angle (FIGS. 14A and 14B) as the content of carbon increases, corresponding to the lattice shrinkage due to the Si—C incorporation.

Figure 15:
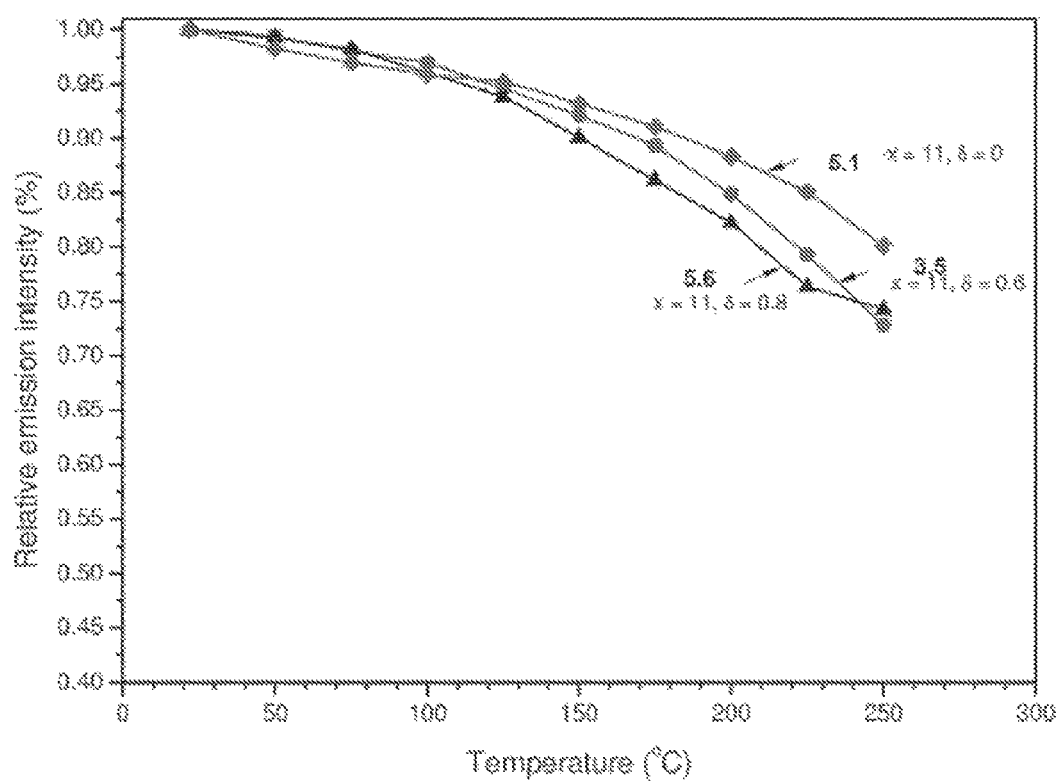
FIG. 15 depicts the thermal quenching profiles of the phosphor compositions of samples 5.1, 3.5, and 5.6.
Figure 16:
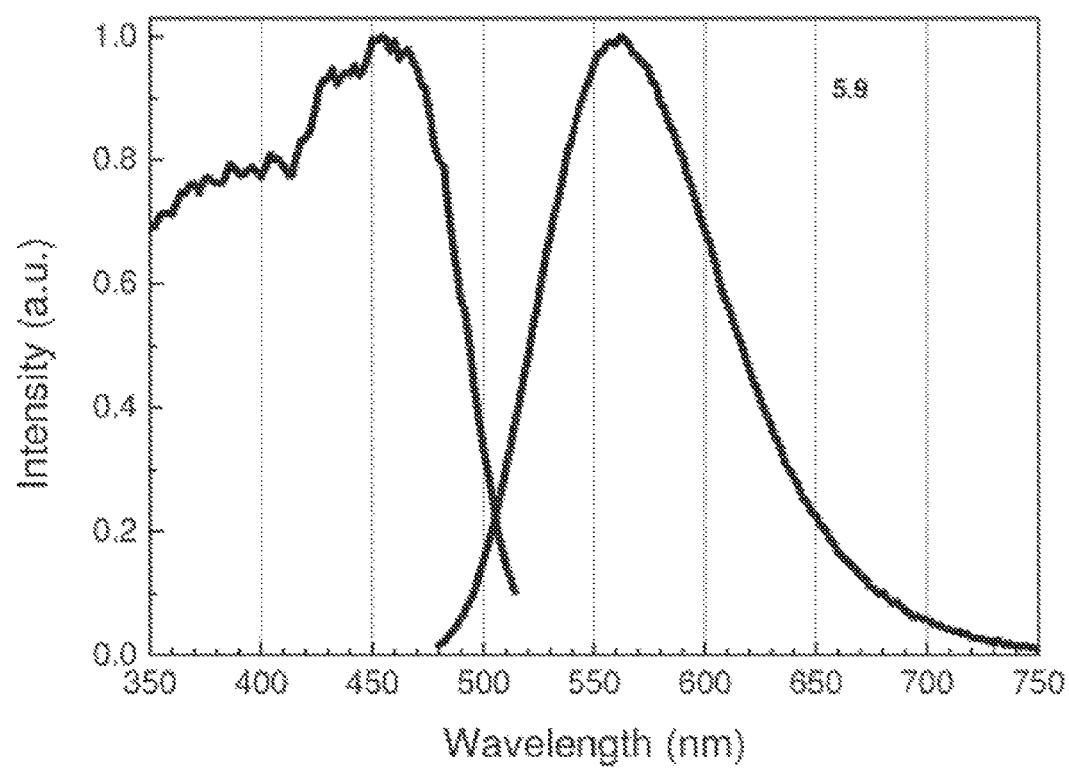
FIG. 16 depicts the excitation profile (left curve) and emission spectrum (right curve) of the phosphor composition of sample 5.9.
Figure 17:
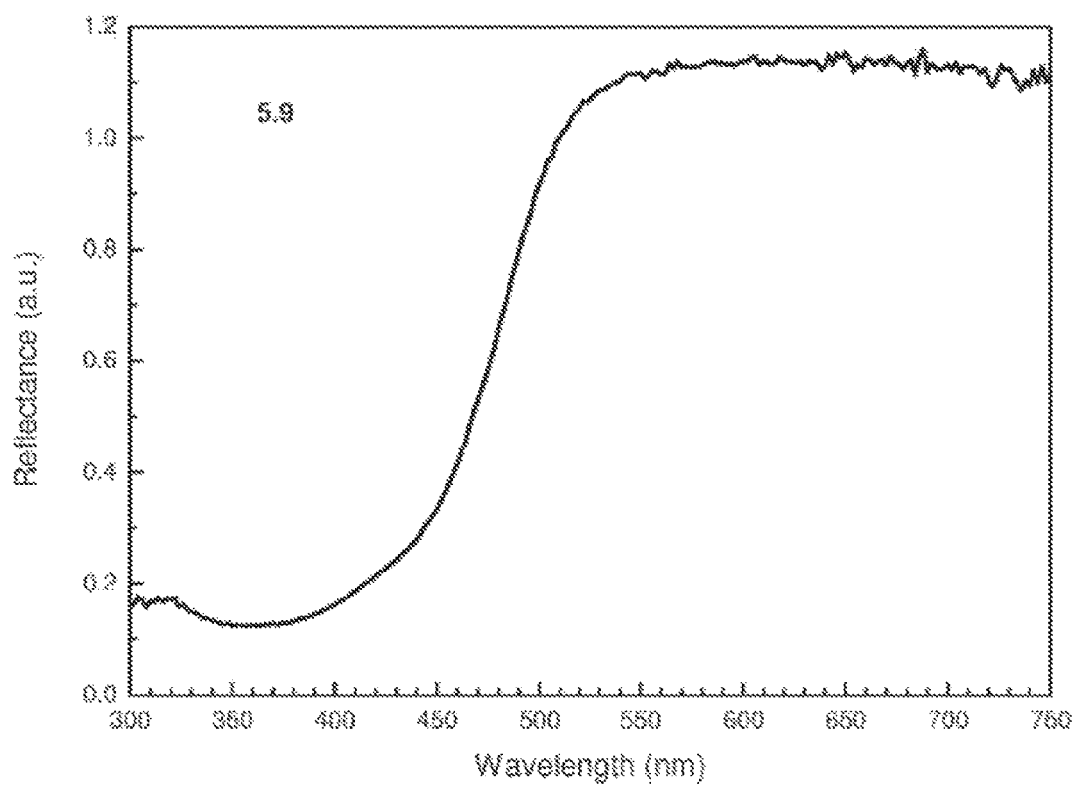
FIG. 17 depicts the reflection spectrum of the phosphor composition of sample 5.9.
Figure 18:
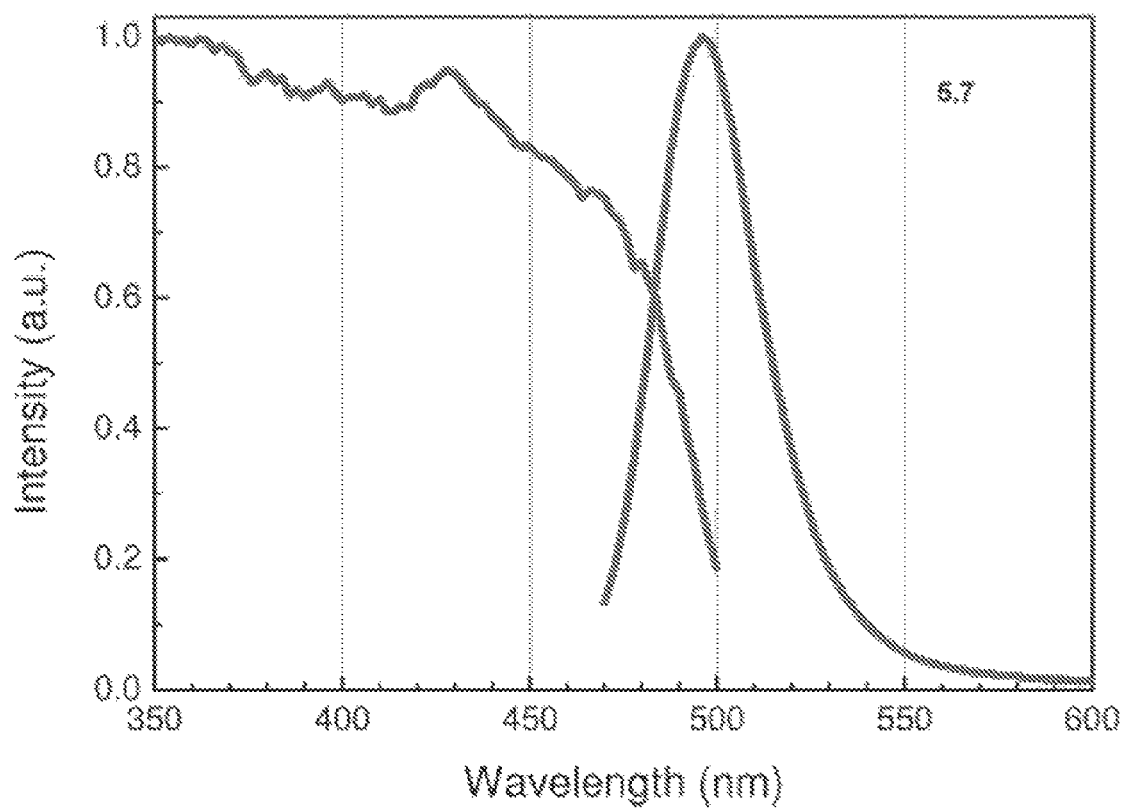
FIG. 18 depicts the excitation profile (left curve) and emission spectrum (right curve) of the phosphor composition of sample 5.7.
Figure 19:
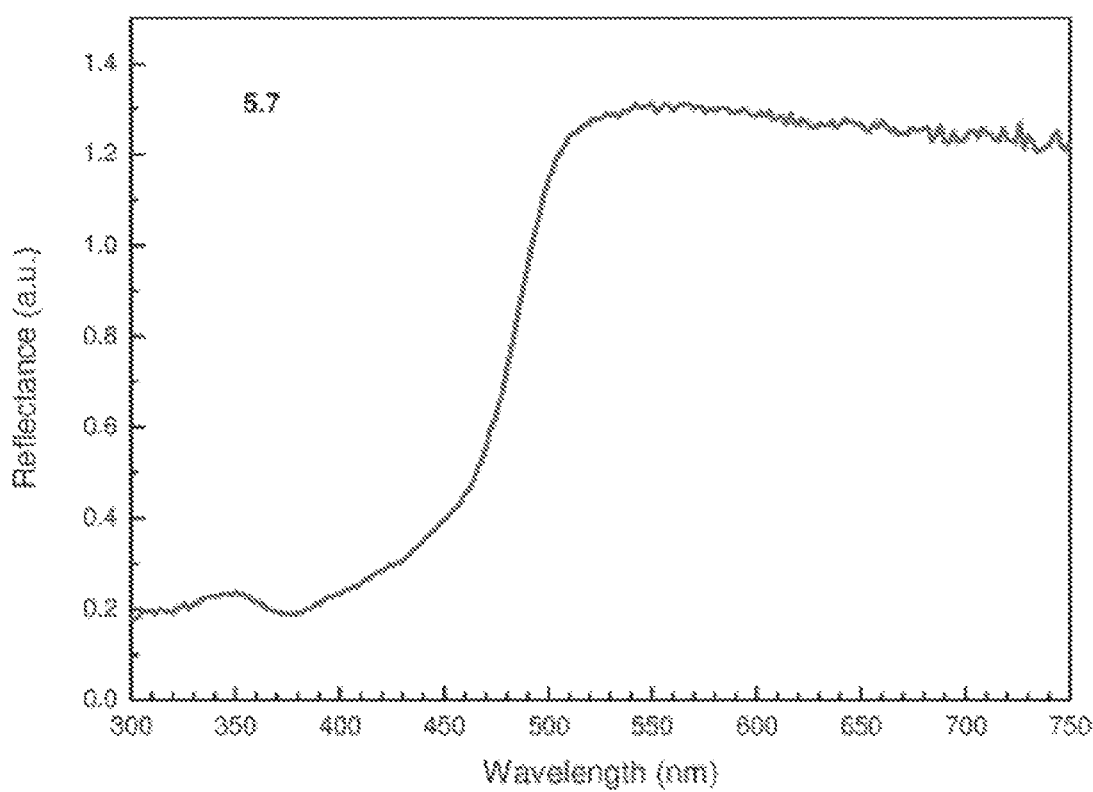
FIG. 19 depicts the reflection spectrum of the phosphor composition of sample 5.7.
Figure 20:
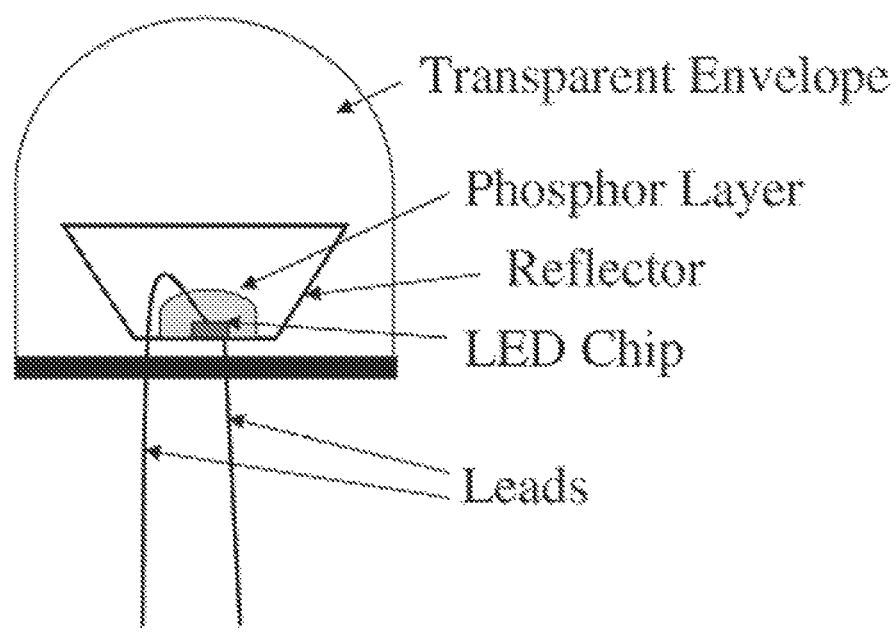
FIG. 20 depicts one embodiment of the light emitting device of the present invention.

The temperature dependencies of the emission intensity for samples 5.1, 5.6, and 3.5 are illustrated in FIG. 15. The luminous maintenance at high temperatures, e.g., 150° C., increases as the ratio of N/O increases. This demonstrates that the N/O ratio in the composition has a clear effect on the thermal stability of the luminescence emission in the high temperature range. The excitation and emission spectra for sample 5.9 is shown in FIG. 16, and its reflection spectrum is shown in FIG. 17. The excitation and emission spectra for sample 5.7 is shown in FIG. 18, and its reflection spectrum is shown in FIG. 19. As shown in FIG. 18, sample 5.7 has a narrow bandwidth compared to other exemplary samples of the invention, about 39 nm, where most other samples have a bandwidth of between about 70 and 80 nm. It is also noted that sample 5.7 peaks at less than 500 nm.

Example 3

The Preparation of Phosphor Compositions of Family (4)

The phosphors of composition $M(II)_7M(III)_{12-x-y}Si_{x+y}O_{25-x\pm3\delta/2}N_{x\pm\delta-y}C_y$:A (M(II)=Sr, Ba, Ca; x+y=12) (or $M(II)_7Si_{12}O_{25-x\pm3\delta/2}N_{x\pm\delta-y}C_y$:Eu$^{2+}$) were prepared by the processes described above. The raw materials were mixed in designed ratios listed in Table 8, Compared with the compositions of Examples 2, the ratio between nitrogen and oxygen in the preparations of this Example 3 is systematically altered by varying the amount of SiO$_2$ and Si$_3$N$_4$ in the starling materials as well as the change of the type of M(II).

Example 4

The Preparation of Phosphor Compositions of Family (6)

The phosphors of composition $M(II)_{7-y}M(I)_y M(III)_{12-x-y-z}Si_{x+y+z}O_{25-x-v/2\pm3\delta/2}N_{x\pm\delta-z}C_zD_v$:A, where M(II)=Sr, M(I)=Li, M(III)=Al, D=F, and A=Eu$^{2+}$, (or $Sr_{7-y}Li_yAl_{12-x-y-z}Si_{x+y+z}O_{25-x-v/2\pm3\delta/2}N_{x\pm\delta-z}C_zF_v$:Eu$^{2+}$) were prepared by the processes described above. The raw materials were mixed in designed ratios listed in Table 9. In this composition, monovalent metal Li and monovalent anion F are incorporated into the composition.

TABLE 8

The amount of starting materials (in grams) and luminescence properties of the phosphor compositions of Example 3 ($M(II)_7M(III)_{12-x-y}Si_{x+y}O_{25-x\pm3\delta/2}N_{x\pm\delta-y}C_y$: Eu$^{2+}$; M(II) = Sr, Ba, Ca; x + y = 12).

| | $M(II)_7Si_{12}O_{25-x\pm3\delta/2}N_{x\pm\delta-y}C_y$: Eu$^{2+}$ | | | | | Luminescence Characteristics | | |
|---|---|---|---|---|---|---|---|---|
| Sample ID | SrCO$_3$ | SiC | SiO$_2$ | Si$_3$N$_4$ | Eu$_2$O$_3$ | QE, % | $\lambda_{em}$, nm | FWHM, nm |
| 5.1 | 2.2137 | 0.0895 | 0.4693 | 0.7826 | 0.1099 | 85.6 | 541 | 77 |
| 5.2 | 2.2137 | 0.1342 | 0.5028 | 0.7043 | 0.1099 | 69.7 | 540 | 76 |
| 5.3 | 2.2137 | 0.1789 | 0.5363 | 0.6261 | 0.1099 | 69.7 | 539 | 78 |
| 5.4 | 2.2137 | 0.2237 | 0.5698 | 0.5478 | 0.1099 | 76.2 | 538 | 77 |
| 5.5 | 2.2137 | 0.2684 | 0.6033 | 0.4695 | 0.1099 | 51.1 | 541 | 77 |
| 5.6 | 2.2269 | 0.0900 | 0.3911 | 0.8502 | 0.1106 | 82.2 | 542 | 77 |

| | $M(II)_7Si_{12}O_{25-x\pm3\delta/2}N_{x\pm\delta-y}C_y$: Eu$^{2+}$ | | | | | | Luminescence Characteristics | | |
|---|---|---|---|---|---|---|---|---|---|
| Sample ID | BaCO$_3$ | SiC | SiO$_2$ | Si$_3$N$_4$ | Eu$_2$O$_3$ | MgO | QE, % | $\lambda_{em}$, nm | FWHM, nm |
| 5.7 | 2.3702 | 0.0717 | 0.3759 | 0.6268 | 0.0881 | 0 | 81.5 | 495 | 39 |
| 5.8 | 2.2343 | 0.0751 | 0.3937 | 0.6565 | 0.0922 | 0.0507 | 40.6 | 494 | 47 |

| | $M(II)_7Si_{12}O_{25-x\pm3\delta/2}N_{x\pm\delta-y}C_y$: Eu$^{2+}$ | | | | | | Luminescence Characteristics | | |
|---|---|---|---|---|---|---|---|---|---|
| Sample ID | CaCO$_3$ | SiC | SiO$_2$ | Si$_3$N$_4$ | Eu$_2$O$_3$ | MgO | QE, % | $\lambda_{em}$, nm | FWHM, nm |
| 5.9 | 1.9686 | 0.1174 | 0.6155 | 1.0265 | 0.1442 | 0 | 33.1 | 563 | 93 |
| 5.10 | 1.7903 | 0.1186 | 0.6219 | 1.0372 | 0.1457 | 0.0801 | 36.9 | 561 | 91 |

TABLE 9

The amount of starting materials (in grams) and luminescence properties of the phosphors of Example 4.

| | $Sr_{7-y}Li_yAl_{12-x-y-z}Si_{x+y+z}O_{25-x-v/2+3\delta/2}N_{x+\delta-z}C_zF_v:Eu^{2+}$ | | | | | | | Luminescence Characteristics | | |
|---|---|---|---|---|---|---|---|---|---|---|
| Sample ID | SrCO$_3$ | AlN | SiO$_2$ | Si$_3$N$_4$ | Li$_2$CO$_3$ | Eu$_2$O$_3$ | SrF$_2$ | SiC | QE, % | $\lambda_{em}$, nm | FWHM, nm |
| 6.1 | 2.2736 | 0.0074 | 0.4139 | 0.8757 | 0.0017 | 0.0548 | 0.0035 | 0.0506 | 36 | 538 | 76 |
| 6.2 | 2.2792 | 0.0074 | 0.4149 | 0.8261 | 0.0017 | 0.0549 | 0.0035 | 0.0952 | 37.3 | 541 | 77 |

Example 5

Preparation of pcLEDs

Example 5a

Green-Emitting Phosphor Composition Combined with Blue-Emitting LED

Figure 21:
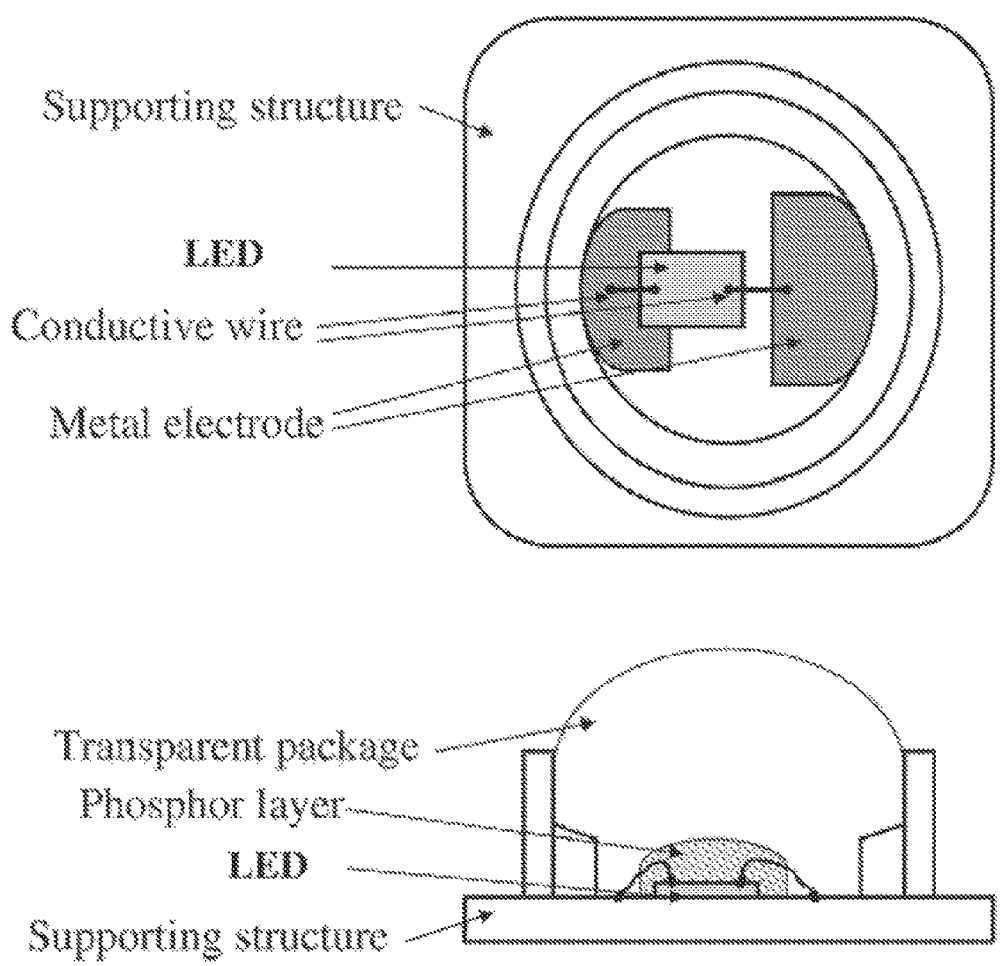
FIG. 21 depicts an embodiment of the light emitting device of the present invention.
Figure 24:
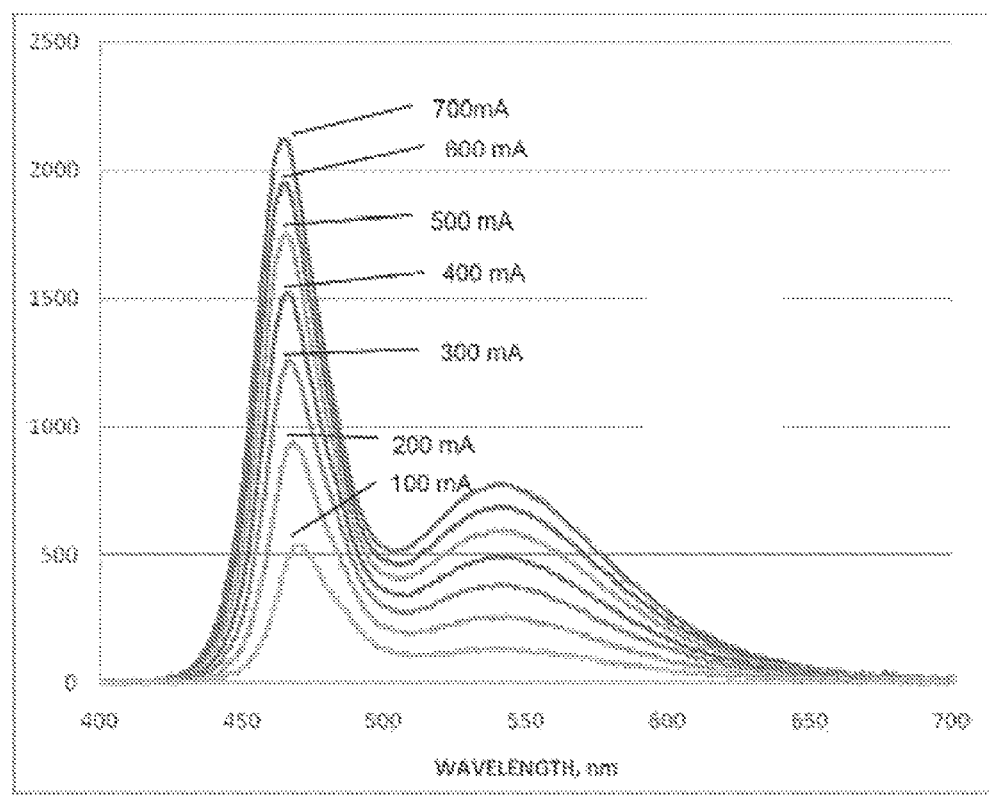
FIG. 24 depicts the emission spectra of a pcLED (at varying operating currents) packaged with the phosphor composition of sample 3.2 and a blue-emitting LED chip.

A green-emitting oxycarbonitride phosphor composition of the present invention, sample 3.2, was applied onto a blue-emitting LED chip in the design shown in FIG. 21. The phosphor composition was mixed with a silicone resin (silicone, Shin-Etsu LPS-2511). The phosphor filled encapsulant composition was then injected onto an AlGaN-based, blue-emitting LED chip followed by a curing treatment according to the manufacturer's curing schedule. The emission spectra of the pcLED at different operating currents are shown in FIG. 24.

Example 5b

Figure 25:
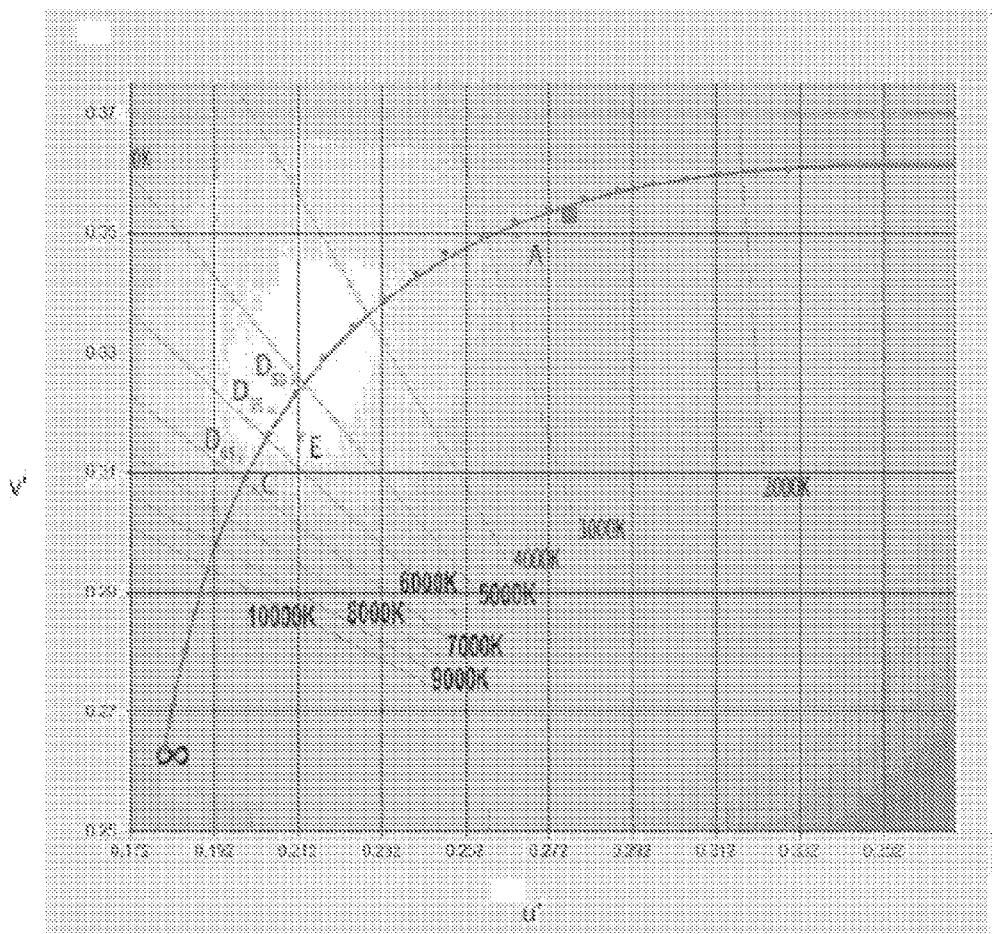
FIG. 25 depicts the luminance properties of the pcLED of Example 5b.
Figure 26:
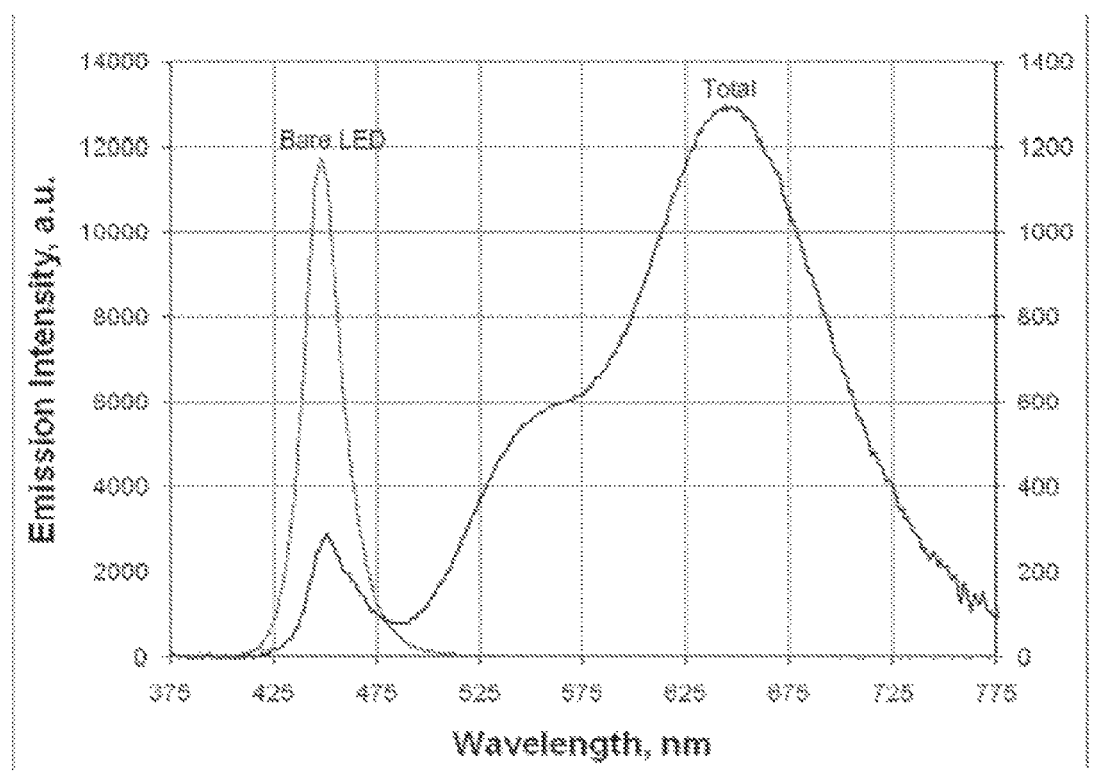
FIG. 26 depicts the emission spectrum of the pcLED of Example 5b. The left curve depicts the spectrum of the bare LED. The right curve depicts the spectrum of the LED combined with the phosphor composition described in Example 5b.

Green-Emitting Phosphor Composition Combined with a Red-Emitting Phosphor and a Blue-Emitting LED A green-emitting oxycarbonitride phosphor composition of the present invention, sample 12, was combined with a second red-emitting phosphor composition (expressed by $Ca_{0.62}Eu_{0.0034}Na_{0.0235}Sr_{0.013}Al_{0.237}B_{0.0255}Si_{0.562}N_{1.94}C_{0.0875}$) to produce white light. The phosphor composition blend was mixed with a silicone resin and was applied to a blue-emitting LED chip by following the procedure described in Example 5a. The luminance properties of the resultant pcLED are displayed in FIG. 25. The emission spectrum of the pcLED is given in FIG. 26. This particular embodiment of phosphor composition blend of the instant invention gives a warm white light and its chromaticity coordinates lie very close to the black body locus with a correlated color temperature (CCT) of ~2800 K and color rendering index (CRI) of 94.

We claim:

1. A composition comprising a phosphor having the formula M(II)$_a$Si$_b$O$_c$N$_d$C$_e$:A, wherein
6<a<8, 8<b<14, 13<c<17, 5<d<9, and 0<e<2;
M(II) comprises at least one divalent cation; and
A comprises a luminescence activator doped in the host crystal of the phosphor.

2. The composition of claim 1, wherein M(II) comprises at least one divalent cation selected from the group consisting of Be, Mg, Ca, Sr, Ba, Cu, Co, Ni, Pd, Zn, and Cd; and, wherein A comprises a luminescence activator selected from the group consisting of Ce, Pr, Nd, Sm, En, Gd, Dy, Ho, Er, Tm, Yb, Lu, Mn, Bi, and Sb.

3. The composition of claim 2, wherein A is doped in the host crystal of the phosphor at the concentration level of 0.001 mol % to 20 mol % relative to M(II).

4. A light emitting device comprising:
a light source emitting a first luminescence spectrum;
a phosphor composition of claim 3; which, when irradiated with light from the light source, emits light having a second luminescence spectrum.

5. The light emitting device of claim 4, further comprising a second phosphor having a formula selected from the group consisting of $Ca_{1-x}Al_{x-xy}Si_{1-x+xy}N_{2-x-xy}C_{xy}:A$;  (a)

$Ca_{1-x-z}Na_zM(III)_{x-xy-z}Si_{1-x+xy+z}N_{2-x-xy}C_{xy}:A$;  (b)

$M(II)_{1-x-z}M(I)_zM(III)_{x-xy-z}Si_{1-x+xy+z}N_{2-x-xy}C_{xy}:A$;  (c)

$M(II)_{1-x-z}M(I)_zM(II)_{x-xy-z}Si_{1-x+xy+z}N_{2-x-xy-2w/3}C_{xy}O_{w-v/2}H_v:A$; and  (d)

$M(II)_{1-x-z}M(I)_zM(III)_{x-xy-z}Si_{1-x+xy+z}N_{2-x-xy-2w/3-v/3}C_{xy}O_wH_v:A$;  (e)

wherein:
0<x<1, 0<y<1, 0≤z<1, 0≤v<1, 0<w<1, x+z<1, x>xy+z, v/2≤w, x−xy−2w/3−v/3<2, and 0<x−xy−z<1;
M(II) is at least one divalent cation;
M(I) is at least one monovalent cation;
M(III) is at least one trivalent cation;
H is at least one monovalent anion; and
A is a luminescence activator.

6. The light emitting device of claim 5, further comprising at least two additional phosphors.

7. The light emitting device of claim 5, wherein the device emits white light.

8. The light emitting device of claim 5, further comprising at least one phosphor selected from the group consisting of $Ca_{1-x}Sr_xS:Eu^{2+}$ (0≤x≤1), $3.5MgO\cdot0.5MgF_2\cdot GeO_2:Mn^{4+}$, $Y_2O_2S:Eu^{3+}$, $M_2Si_5N_8:Eu^{2+}$ (M=Ca, Sr, Ba), MAlSiN$_3$Eu$^{2+}$ (M=Ca, Sr), $Y_2Si_4N_6C:Eu^{2+}$, $CaSiN_2:Eu^{2+}$, $Ca_{1-x}Sr_xGa_2S_4:Eu^{2+}$ (0≤x≤1), $Ca_{1-x-y-z}Mg_xSr_yBa_zSiO_4:Eu^{2+}$ (0≤x≤1, 0≤y≤1, 0≤z≤1, x+y+z≤1), $BaMgAl_{10}O_{17}:Eu^{2+}$, $Mn^{2+}$, $MYSi_4N_7:Eu^{2+}$ (M=Ca, Sr, Ba), β-sialon:Eu$^{2+}$, $MSi_2O_2N_2:Eu^{2+}$ (M=Ca, Sr, Ba), $Ba_3Si_6O_{12}N_2:Eu^{2+}$, $M_2Si_5N_8:Ce^{3+}$ (M=Ca, Sr, Ba), $Y_2Si_4N_6C:Ce^{3+}$, α-sialon:Yb$^{2+}$, $(MSiO_3)_m\cdot(SiO_2)_n:Eu^{2+}$, X (M=Mg, Ca, Sr, Ba; X=F, Cl, Br, I; m is 1 or 0, and either (i) n>3 if m=1 or (ii) n=1 if m=0), $MAl_2O_4:Eu^{2+}$ (M=Mg, Ca, Sr), $BaMgAl_{10}O_{17}:Eu^{2+}$, $Y_3Al_5O_{12}:Ce^{3+}$ (cerium-doped garnet type phosphor), and α-sialon:Eu$^{2+}$.

* * * * *